(12) United States Patent
Dupuy et al.

(10) Patent No.: US 9,263,787 B2
(45) Date of Patent: Feb. 16, 2016

(54) POWER COMBINER AND FIXED/ADJUSTABLE CPL ANTENNAS

(71) Applicant: DockOn AG, Zurich (CH)

(72) Inventors: Alexandre Dupuy, San Diego, CA (US); Forrest Brown, San Diego, CA (US); Patrick Rada, San Diego, CA (US)

(73) Assignee: DOCKON AG, Zurich (CH)

( * ) Notice: Subject to any disclaimer, the term of this patent is extended or adjusted under 35 U.S.C. 154(b) by 0 days.

(21) Appl. No.: 14/213,897

(22) Filed: Mar. 14, 2014

(65) Prior Publication Data

US 2014/0266962 A1    Sep. 18, 2014

Related U.S. Application Data

(60) Provisional application No. 61/798,521, filed on Mar. 15, 2013.

(51) Int. Cl.
*H01P 5/12* (2006.01)
*H01P 5/19* (2006.01)
(Continued)

(52) U.S. Cl.
CPC .. *H01P 5/19* (2013.01); *H01Q 7/00* (2013.01); *H01Q 21/0075* (2013.01); *H03D 1/08* (2013.01); *H03D 1/18* (2013.01); *H03D 7/02* (2013.01); *H03D 7/12* (2013.01); *H03D 7/165* (2013.01);
(Continued)

(58) Field of Classification Search
CPC .............. H03H 7/46; H03H 7/48; H01P 5/19; H01Q 7/00; H01Q 21/0075; H03D 1/08; H03D 1/18; H03D 7/02; H03D 7/12; H03D 7/165; H03F 3/191

USPC ................... 333/126–129, 132, 100
See application file for complete search history.

(56) References Cited

U.S. PATENT DOCUMENTS 2,363,651 A    11/1944    Crosby
2,644,081 A    6/1953    Donald
(Continued)

FOREIGN PATENT DOCUMENTS

EP    1384281 A2    1/2004
GB    2354329 A    3/2001
(Continued)

OTHER PUBLICATIONS

U.S. Appl. No. 14/213,529, filed Mar. 14, 2014, Rada et al.
(Continued)

*Primary Examiner* — Robert Pascal
*Assistant Examiner* — Kimberly Glenn
(74) *Attorney, Agent, or Firm* — Baker & Hostetler LLP

(57) ABSTRACT

An N-way radio frequency (RF) divider/combiner is formed as a combination including an input port electrically coupled to a first 2-way divider/combiner and a second 2-way divider/combiner. An antenna may be coupled to at least one port of the N-way divider. The antenna may be formed as a compound printed loop (CPL) antenna. The N-way RF divider/combiner may be configured to provide N inputs and M output ports, wherein N and M are integers and any of the M output ports and N input ports can be connected to any combinations of devices. Such devices may include, e.g., an antenna including but not limited to a CPL antenna, RF receive port, transmit port, amplifier, RF switch, low noise amplifier (LNA), oscillator, tuning circuit, matching circuit, lumped element circuit, active circuit, diode, adjustable inductive circuit, and adjustable capacitive circuit.

21 Claims, 21 Drawing Sheets

(51) Int. Cl.

| | | |
|---|---|---|
| H03D 1/08 | (2006.01) | |
| H01Q 7/00 | (2006.01) | |
| H01Q 21/00 | (2006.01) | |
| H03D 1/18 | (2006.01) | |
| H03D 7/02 | (2006.01) | |
| H03D 7/12 | (2006.01) | |
| H03D 7/16 | (2006.01) | |
| H03F 3/191 | (2006.01) | |

(52) U.S. Cl.
CPC ........ *H03F 3/191* (2013.01); *H03D 2200/0043* (2013.01); *H03D 2200/0098* (2013.01)

(56) References Cited

U.S. PATENT DOCUMENTS

| | | |
|---|---|---|
| 3,092,779 A | 6/1963 | De Niet |
| 3,320,530 A | 5/1967 | Pearman |
| 3,337,807 A | 8/1967 | Brown |
| 3,602,819 A | 8/1971 | Abbott et al. |
| 3,668,535 A | 6/1972 | Lansdowne |
| 3,724,954 A | 4/1973 | Dreyfoos |
| 3,791,272 A | 2/1974 | Nobusawa |
| 4,034,298 A | 7/1977 | McFadyen et al. |
| 4,393,514 A | 7/1983 | Minakuchi et al. |
| 4,510,624 A | 4/1985 | Thompson et al. |
| 4,609,994 A | 9/1986 | Bassim et al. |
| 4,660,192 A | 4/1987 | Pomatto |
| 1,424,065 A | 7/1992 | Armstrong |
| 5,479,442 A | 12/1995 | Yamamoto |
| 5,621,756 A | 4/1997 | Bush et al. |
| 5,771,026 A | 6/1998 | Stengel |
| 5,789,996 A | 8/1998 | Borodulin |
| 5,995,814 A | 11/1999 | Yeh |
| 6,035,002 A | 3/2000 | Schleifer |
| 6,054,900 A | 4/2000 | Ishida et al. |
| 6,389,275 B1 | 5/2002 | Kawashima et al. |
| 6,420,937 B1 | 7/2002 | Akatsuka et al. |
| 6,421,535 B1 | 7/2002 | Dickerson et al. |
| 6,518,856 B1 | 2/2003 | Casale et al. |
| 6,538,528 B2 * | 3/2003 | Louzir et al. ................. 333/128 |
| 6,574,287 B1 | 6/2003 | Swaminathan et al. |
| 6,668,165 B1 | 12/2003 | Cloutier |
| 6,668,619 B2 | 12/2003 | Yang et al. |
| 6,670,849 B1 | 12/2003 | Damgaard |
| 7,215,936 B2 | 5/2007 | Sadowski |
| 7,423,931 B2 | 9/2008 | Martin et al. |
| 7,567,099 B2 | 7/2009 | Edwards et al. |
| 7,612,616 B2 | 11/2009 | Deng |
| 7,751,996 B1 | 7/2010 | Ardizzone et al. |
| 7,819,022 B2 | 10/2010 | Hope |
| 7,848,384 B2 | 12/2010 | Pelissier et al. |
| 7,911,235 B2 | 3/2011 | Brown |
| 8,040,204 B2 | 10/2011 | Brown |
| 8,064,864 B2 | 11/2011 | Rofougaran |
| 8,144,065 B2 | 3/2012 | Brown |
| 8,149,173 B2 | 4/2012 | Brown |
| 8,164,532 B1 | 4/2012 | Brown |
| 8,265,769 B2 | 9/2012 | Denison |
| 8,326,340 B2 | 12/2012 | Nalbantis et al. |
| 8,364,098 B2 | 1/2013 | Ridgers |
| 8,368,485 B2 | 2/2013 | Brown |
| 8,462,031 B2 | 6/2013 | Belot et al. |
| 8,542,768 B2 | 9/2013 | Kim et al. |
| 8,644,776 B1 | 2/2014 | Nobbe et al. |
| 8,676,521 B2 | 3/2014 | Vennelakanti et al. |
| 2002/0109607 A1 | 8/2002 | Cumeral et al. |
| 2004/0229585 A1 | 11/2004 | Lu et al. |
| 2004/0240588 A1 | 12/2004 | Miller |
| 2005/0009480 A1 | 1/2005 | Vakilian et al. |
| 2005/0069051 A1 | 3/2005 | Lourens |
| 2005/0270172 A1 | 12/2005 | Bailey et al. |
| 2006/0028297 A1 | 2/2006 | Kang et al. |
| 2006/0226897 A1 | 10/2006 | Ruijter |
| 2007/0030099 A1 | 2/2007 | Carpentier et al. |
| 2007/0066265 A1 | 3/2007 | May |
| 2007/0105521 A1 | 5/2007 | Granata |
| 2007/0139130 A1 | 6/2007 | Kim et al. |
| 2007/0207749 A1 | 9/2007 | Rozenblit et al. |
| 2008/0101185 A1 | 5/2008 | Rozenblit et al. |
| 2008/0176529 A1 | 7/2008 | Lau |
| 2008/0269841 A1 | 10/2008 | Grevious et al. |
| 2009/0079524 A1 | 3/2009 | Cyr et al. |
| 2009/0079607 A1 | 3/2009 | Denison et al. |
| 2009/0147837 A1 | 6/2009 | Lau |
| 2009/0322544 A1 | 12/2009 | McDowell |
| 2010/0080270 A1 | 4/2010 | Chen et al. |
| 2010/0152644 A1 | 6/2010 | Pesach et al. |
| 2010/0225417 A1 | 9/2010 | Mistretta et al. |
| 2010/0308999 A1 | 12/2010 | Chornenky |
| 2010/0313958 A1 | 12/2010 | Patel et al. |
| 2011/0007844 A1 | 1/2011 | Park et al. |
| 2011/0018777 A1 | 1/2011 | Brown |
| 2011/0037516 A1 | 2/2011 | Nejati et al. |
| 2011/0093220 A1 | 4/2011 | Yang et al. |
| 2011/0212692 A1 | 9/2011 | Hahn et al. |
| 2011/0234316 A1 | 9/2011 | Kim et al. |
| 2011/0301882 A1 | 12/2011 | Andersen |
| 2012/0019336 A1 | 1/2012 | Khan et al. |
| 2012/0106560 A1 | 5/2012 | Gumaste |
| 2012/0112852 A1 | 5/2012 | Manssen et al. |
| 2012/0121030 A1 | 5/2012 | Luo et al. |
| 2012/0164644 A1 | 6/2012 | Neely et al. |
| 2012/0190317 A1 | 7/2012 | Martineau et al. |
| 2012/0280754 A1 | 11/2012 | Gorbachov |
| 2013/0029350 A1 | 1/2013 | Cooper et al. |
| 2013/0059548 A1 | 3/2013 | Umeda et al. |
| 2013/0113666 A1 | 5/2013 | Orsi et al. |
| 2013/0128934 A1 | 5/2013 | Kang et al. |
| 2014/0150554 A1 | 6/2014 | Rada et al. |
| 2014/0154991 A1 | 6/2014 | Brown et al. |
| 2014/0266420 A1 | 9/2014 | Brown et al. |
| 2014/0269972 A1 | 9/2014 | Rada et al. |
| 2014/0273898 A1 | 9/2014 | Brown et al. |
| 2014/0287704 A1 | 9/2014 | Dupuy et al. |

FOREIGN PATENT DOCUMENTS

| | | |
|---|---|---|
| JP | 56-138340 A | 10/1981 |
| JP | S 60-249436 A | 12/1985 |
| JP | 56-138342 A | 10/1991 |
| JP | 10-075273 A | 3/1998 |
| WO | WO 00/35124 A2 | 6/2000 |
| WO | WO 02/084782 A2 | 10/2002 |
| WO | WO 2008/075066 A2 | 6/2008 |
| WO | WO 2012/153147 A1 | 11/2012 |

OTHER PUBLICATIONS

U.S. Appl. No. 14/216,945, filed Mar. 17, 2014, Rada et al.
Sanders B.J.; "Radical Combiner Runs Circles Around Hybrids," MicroWaves; Nov. 1980; vol. 19, No. 12; p. 55-58.
Caloz et al.;"Metamaterials for High-Frequency Electronics"; Proceedings of the IEEE; vol. 93; No. 10; Oct. 2005; p. 1744-1752.
Insam; "Designing Super-Regenerative Receivers"; Electronic World; Apr. 2002; 19 pages.
International Patent Application No. PCT/US2014/029577; Int'l Preliminary Report on Patentability; dated Jun. 19, 2015; 17 pages.
International Patent Application No. PCT/US2014/029832; Int'l Preliminary Report on Patentability; dated Mar. 11, 2015; 7 pages.

* cited by examiner

FIG. 2A: 2-WAY POWER COMBINER/SPLITTER WITH TAPPER LINE (PRIOR ART)

WI-FI 2.4-2.5GHZ SPECTRUM WITH DIFFERENT APS AND SOME ROGUE CLIENTS

RF input

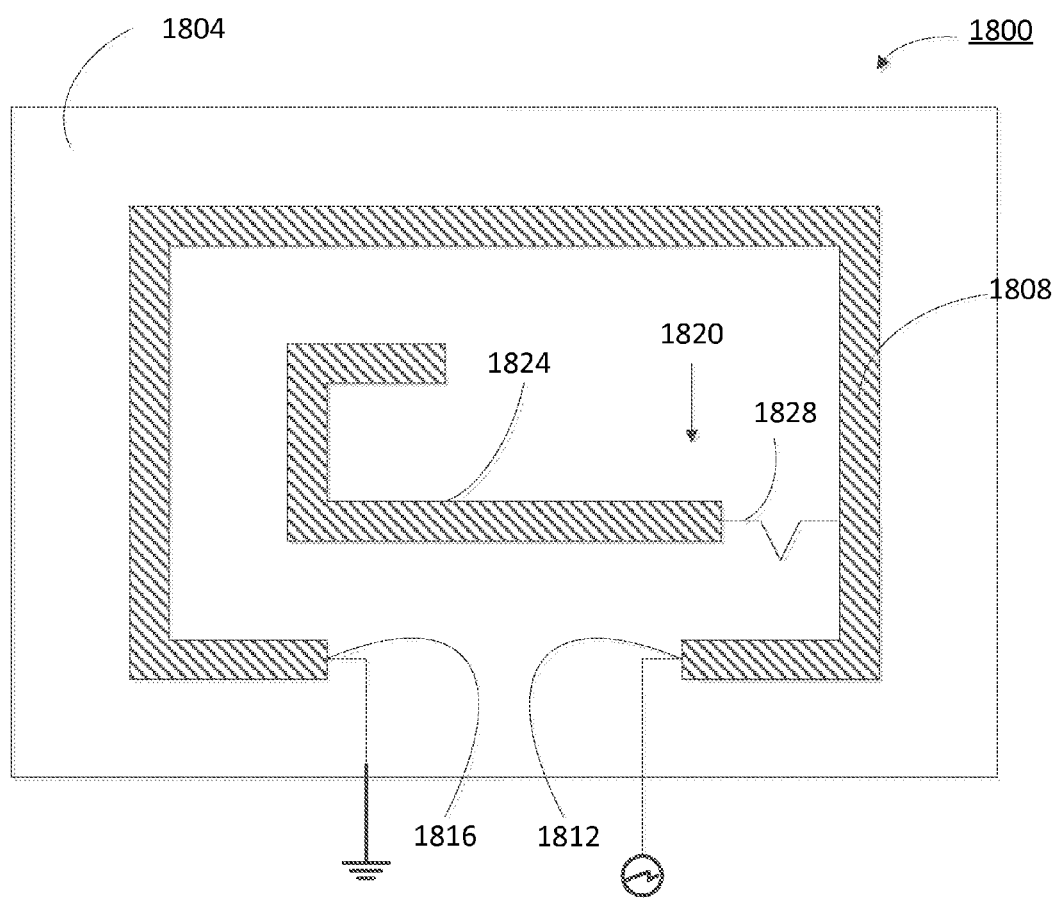
FIG. 18 Planar CPL Antenna

US 9,263,787 B2

POWER COMBINER AND FIXED/ADJUSTABLE CPL ANTENNAS

CROSS REFERENCE TO RELATED APPLICATIONS

This application claims the benefit of U.S. Provisional Patent Application Ser. No. 61/798,521, filed Mar. 15, 2013, entitled "Logarithmic Amplifier With Universal Demodulation Capabilities," which is hereby incorporated by reference in its entirety.

TECHNICAL FIELD

The present disclosure relates to electronic circuitry for combining and splitting radio frequency power. The invention is especially suited, although by no means limited, for use in a system including fixed and adjustable CPL antennas.

BACKGROUND

The present invention relates to a multipart splitter/divider or combiner. It finds particular, but not exclusive, use in allowing a single transceiver to be connected to a plurality of antennas, power amplifiers, oscillators or other devices. As understood by those skilled in the art, it is often advantageous to be able to drive more than one transmitting antenna, or to receive signals from more than one receiving antenna. For example, having more than one receive antenna allows a degree of receive diversity to be employed and can increase the received signal strength. However, due to problems in impedance mismatch, it is not a simple matter of connecting more than one antenna to the respective input or output of a transceiver. The present invention provides improvements in the field of radio frequency (RF) combiners/splitters and related circuitry.

Throughout the specification which follows, reference will be made to splitting or dividing a signal into two or more components, but the skilled person will appreciate that such description also includes combining two or more signals together, since these structures are intrinsically bi-directional. Additional background information may be found in U.S. Pat. No. 8,040,204 B2, Oct. 18, 2011, entitled "Radio Frequency Combiners/Splitters" (Brown), which describes the well-known Wilkinson Divider/Combiner and an improved RF divider arranged in the form of a microstrip circuit. See also, U.S. Pat. No. 8,368,485 B2, Feb. 5, 2013, "Radio Frequency Combiners/Splitters".

SUMMARY

In an illustrative embodiment, a system in accordance with the present invention comprises an N-way radio frequency (RF) divider/combiner and a connecting circuit for connecting the respective 2-way dividers together. The N-way divider is formed as a combination including an input port electrically coupled to a first 2-way divider and a second 2-way divider, and the connecting circuit is electrically coupled to the input port and each of the first and second 2-way dividers.

In a presently preferred embodiment, each 2-way divider is configured to receive electrical energy at a first, common port and guide the electrical energy to second and third ports. The second and third ports are separated by a generally rectangular bridge bar having a width selected to match the impedance of one or more devices to be connected to the second and third ports, respectively, and a length selected to provide a separation between the two ports of substantially ¼ wavelength at a center point of an operational frequency of the system. The first, common port is coupled to the bridge bar by a generally tapering microstrip section having a relatively thinner end and a relatively wider end, the relatively thinner end connected to the first, common port and the relatively wider end connected along a part of the length of the bridge bar. The generally tapering microstrip section provides a separation between the first, common port and each of the second and third ports of substantially ¼ wavelength at the center point.

The inventive system may also include an antenna electrically coupled to at least one port of the N-way divider. The antenna may be formed as a compound printed loop (CPL) antenna. Moreover, in the illustrative embodiments, all of the ports of the N-way RF divider are capable of being connected to an antenna or to an electrical circuit or component. The N-way RF divider may be configured to provide N inputs and M output ports, wherein N and M are integers and any of the M output ports and N input ports can be connected to any combinations of devices. Such devices may include, e.g., an antenna including but not limited to a CPL antenna, RF receive port, transmit port, amplifier, RF switch, low noise amplifier (LNA), oscillator, tuning circuit, matching circuit, lumped element circuit, active circuit, diode, adjustable inductive circuit, and adjustable capacitive circuit.

In one of the illustrative embodiments, at least one of the CPL antennas is configured to have adjustable properties. In addition, each CPL antenna may be a passive antenna, a passive and adjustable antenna, or an active antenna. The illustrative embodiments may also include an RF switch connected between a first output port of the N-way divider and an antenna coupled to the first output port. An RF switch may also be connected between each output port and the corresponding antenna connected to the output port, and the system may be configured to selectively shape the overall radiating pattern of the combination of RF antennas.

Other features of the present invention are described below.

BRIEF DESCRIPTION OF THE DRAWINGS

FIG. 2A depicts a 2-way power combiner/splitter with taper line.

FIG. 18 depicts a planar CPL antenna.

DETAILED DESCRIPTION OF ILLUSTRATIVE EMBODIMENTS

Power combiners/dividers occupy an important role in almost any RF and microwave communication system because of their ability to combine or divide power. Different types of power combiners/dividers exist, such as spatial combiners, resonant or non-resonant with serial and N-way radial combiners. These power combiners/dividers are used in the design of power amplifiers, antenna arrays to combine or split the RF signal, and other RF applications. The N-way radial power combiners/dividers present the advantage of being less bulky than the serial or spatial power combiners/dividers. Radial power combiners can feed multiple ports from a single point, which improves the combining efficiency. N-way radial combiners are widely used, with up to 110 ports combined (see, e.g., the paper "Radial Combiner Runs Circles Around Hybrids," Microwaves, vol. 19, no. 12, pp. 55-58, November 1980 by B. J. Sanders).

Figure 1:
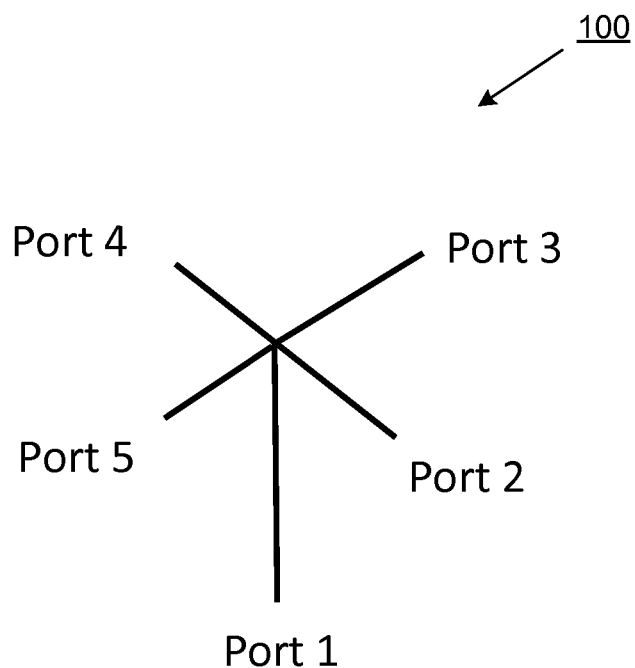
FIG. 1 schematically depicts a conventional radial power combiner/splitter.

N-way radial power combiners/dividers possess the advantage of having lower loss than other types of power combiner/divider when the number of branches increases. Conventional radial power combiners/dividers use a multiple of quarter-wavelength (i.e., λ/4 or) 90° line between the center feeding line and the output ports. These λ/4 lengths permit the circuit to divide equally the input power to the different ports at each branch. Usually all the ports are terminated in 50 Ohm loads, and therefore the λ/4 (90°) transmission line segments enable one to match all the ports to the wanted impedance. FIG. 1 illustrates a conventional radial power combiner/splitter 100. The electrical length of each arm of the power combiner can be λ/4 (90°) in the case of an even split between the ports. In the following paragraphs, we describe an N-way radial power combiner/splitter using tapering microstrips to connect the different ports in order to minimize the losses and also increase the isolation between each port.

2-Way Combiner/Splitter with Taper Line

Embodiments of the present invention incorporate the 2-way combiner/splitter disclosed by U.S. Pat. No. 8,040,204 B2, which is hereby incorporated by reference (see specifically columns 2-4). See also, U.S. Pat. No. 8,368,485 B2. (For simplicity, we sometimes refer to these devices as a "combiner" or "divider", it being understood that they are inherently capable of operating in either mode.) These embodiments realize the aim of splitting a signal or combining a plurality of signals in a simple manner, without the need for any discrete components, using only microstrip/coplanar waveguide (CPW)/coplanar waveguide grounded (CPWG) techniques. FIG. 2A shows an embodiment constructed using microstrip techniques, i.e., the traces are formed by selective removal of metal from a circuit board. The removal can be effected by any suitable means such as etching, milling or laser removal.

Referring to FIG. 2A, the geometry of the taper line may be determined in accordance with U.S. Pat. No. 8,040,204. FIG. 2A shows an embodiment of the microstrip divider circuit constructed using microstrip techniques, i.e., the traces are formed by selective removal of metal from a circuit board. The removal can be effected by any suitable means such as etching or laser removal. The divider 100 of FIG. 2A comprises a first port 101 and two output ports 102, 103. Each input port may also be an output port and vice-versa as the divider may also function as a combiner, i.e., it is inherently bi-directional. The input port 101 is located adjacent the vertex of a generally triangular section which tapers outwards to join a generally rectangular section, at whose respective ends are located ports 102, 103. The port 101 is actually at the end of a short, generally rectangular section. The width of this section is determined by the characteristic impedance of the device connected thereto. For instance, if port 101 is to be connected to a device having an impedance of 50 Ohm, then the width of the rectangular second can be calculated accordingly using known techniques and based on the characteristics of the circuit board. The triangular section joining port 101 to ports 102, 103 serves to provide a generally wideband match between the characteristic impedance of port 101 and ports 102, 103.

The characteristic impedance of each port will typically be 50 Ohms Therefore, the tapering triangular section should match the 50 Ohm impedance of port 101 to an impedance of 25 Ohms formed by ports 102 and 103 being arranged, effectively, in parallel. The slowly tapering outline of the triangular section serves to provide a slow transition from 50 Ohms at port 101 to 25 Ohms. It also provides isolation of >20 dB between ports 102 and 103. Ports 102 and 103 are separated by a generally rectangular element 104, called a bridge bar. The dimensions of the bridge bar are selected such that its width (smallest dimension in the plane) is determined by the characteristic impedance of the devices connected to ports 102 and 103. Its length (longest dimension in the plane) is set so that ports 102 and 103 are a quarter-wavelength apart at the center frequency of operation of the divider. Also, the physical separation between port 101 and 102 and between port 101 and 103 is set to be a quarter of a wavelength at the center frequency of operation. This structure provides the required isolation between ports. This can be explained as follows: a signal appearing at port 101 which travels to port 102 and is reflected back has had a 90° phase shift on each leg of its journey, meaning that, by the time it arrives back at port 101, it is out of phase and so cancels itself out. This is true for all the ports, ensuring that there is good isolation between them all. The tapered section ensures that this isolation is achieved across a wider bandwidth than would be the case if it were absent. In practice, isolation of greater than 30 dB has been achieved. The structure of FIG. 2A offers a bandwidth of an octave and a half, and requires no external components to achieve this, making it very simple to implement and cost-effective.

FIG. 2A also shows some added constructional details to explain how certain of the dimensions of the divider are arrived at. The dotted rectangle 110 has a height equivalent to the tapering section of the triangular portion and a width equivalent to the mean width of the tapering section. If the microstrip construction were adapted such that the tapering section were replaced with the dotted rectangular section, the rectangular section would provide a narrow band match between port 101 and ports 102, 103. It can be seen that the area of the dotted rectangular section corresponds to the area of the triangular section. Conceptually, it is possible to imagine that the triangular portion 114 is removed from the rectangle 110 and positioned to form triangular portion 112. The same happens on the other side of the triangular portion. The width of the rectangular portion 110 is determined by the line impedance required to transform the impedance of port 101 into the ports 102 and 103 in parallel. The formula:

$$\sqrt{Z_{101}(Z_{102}//Z_{103})}$$

can be used to determine the width of the rectangular portion by taking the square root of the product of the impedance of port 101 and the parallel effect of the impedances at ports 102 and 103. If all the ports are 50 Ohms, then ports 102 and 103 in parallel will present an impedance of 25 Ohm. This then gives a value for $Z_{width}$ of 35.36 Ohm. From this value of impedance, the width can be directly determined using known techniques.

The tapering section acts in practice like a series of discrete L-C circuits, which act to provide a wideband match. If the tapered section is created using linear gradients, i.e., the width of the tapered section changes uniformly, then the matching performance is linear. If, the tapered section is made non-linear e.g. it has convex, concave or other curved portions, then the matching performance can be made to alter in a non-linear fashion too. For instance, if a device were connected to one of the ports and its characteristic impedance alters with frequency, then the tapered section can be designed to accommodate this and ensure that a good match is achieved at all frequencies of operation.

It can be seen that the 2-way combiner/splitter can provide a simple, low-cost alternative to the Wilkinson Divider, requiring no external components and offering better power performance (lower insertion loss) over a wider bandwidth. Also, since no matching resistor is needed, there is no corresponding insertion loss, resulting in enhanced power performance.

An alternative embodiment provides a divider operable over an even greater bandwidth, or it can be implemented as a dual-band device. This is described with reference to FIG. 4 of U.S. Pat. No. 8,040,204. This embodiment differs from the one described above in that the tapered section no longer has linear edges, but rather the outer edges are jagged and comprise a generally saw-tooth or zig-zag structure. The effect of this is to cause the divider to operate over two discrete frequency bands. The first is determined as before by the characteristic shape of the tapered structure assuming that the jagged edges are not there and the outer edges are smooth. The second band of operation is altered by the presence of the jagged edges, which in microstrip circuits have different reactive qualities. By careful design of the physical layout, using known techniques, the skilled person can design a divider operable over two discrete frequency bands. It is possible to design the two frequency bands so that they overlap, offering a device operable over one wider band than is possible using the design of FIG. 2A alone.

Embodiments of the 2-way combiner find particular use in radio frequency (RF) devices operable over at least two bands. It is quite common to offer cellular telephones which operate on at least two bands and by use of the above-described structures two different antennas can be provided—one for each band—and they can be connected via a divider to a single radio transceiver. The frequency of operation of devices using this technology will generally be in the GHz range, and used with wireless telephony and wireless data access devices.

U.S. Pat. No. 8,368,485 describes another embodiment including a horizontal RF choke joint positioned between the first port and the tapering section. In a further embodiment, left and right vertical RF choke joints are positioned between the second port and the bridge bar and the third port and the bridge bar, respectively. (See FIGS. 6 and 8 of the '485 patent.) The horizontal choke joints enable the ports to be connected to resistive loads, in addition to reactive loads. For example, the horizontal choke joint may be configured as an RF choke at the center frequency of operation of the combiner/splitter. The horizontal choke joint effectively stops the mismatch from the first port to the third port and the mismatch from the first port to the second port from reflecting back into the first port when the first port is connected to a load. The dimensions of the choke joint can be adjusted as necessary to maximize the performance of the combiner/splitter. For example, the thinner the choke joint, the narrower the frequency of operation. Conversely, the thicker the choke joint, the wider the frequency of operation. The relationship between the dimensions of the choke joint and the center frequency of operation also applies to embodiments of a combiner/splitter using a left vertical choke joint near the second port and a right vertical choke joint near the third port, with the dimensions widening or narrowing the frequency of operation.

N-Way Radial Power Splitter/Combiner with Antennas

The n-way radial power combiners provided by the present invention can have an important place in a radio base station where the power is high or in a distributed antenna system (DAS) where the requirement for Passive Inter modulation (PIM) are very stringent. Any antenna can be used with these power combiners/splitters but a preferred antenna is a compound printed loop (CPL) antenna, available from DockOn Inc., which can excite both Transverse Electric (TE) and Transverse Magnetic (TM) modes. These antennas have a high gain, high efficiency, low return loss, low VSWR (i.e., voltage standing wave ratio), and a wide bandwidth of more than one octave. Depending on the application, the radiation pattern can be omnidirectional or directional.

Figure 2B:
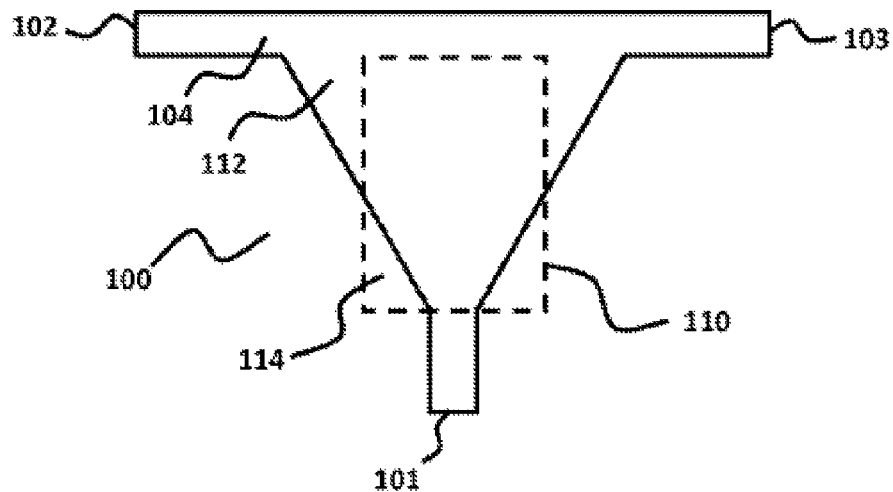
FIG. 2B depicts an inventive system including a 4-way radial power combiner/splitter with tapper lines in accordance with the present invention.
Figure 2B:
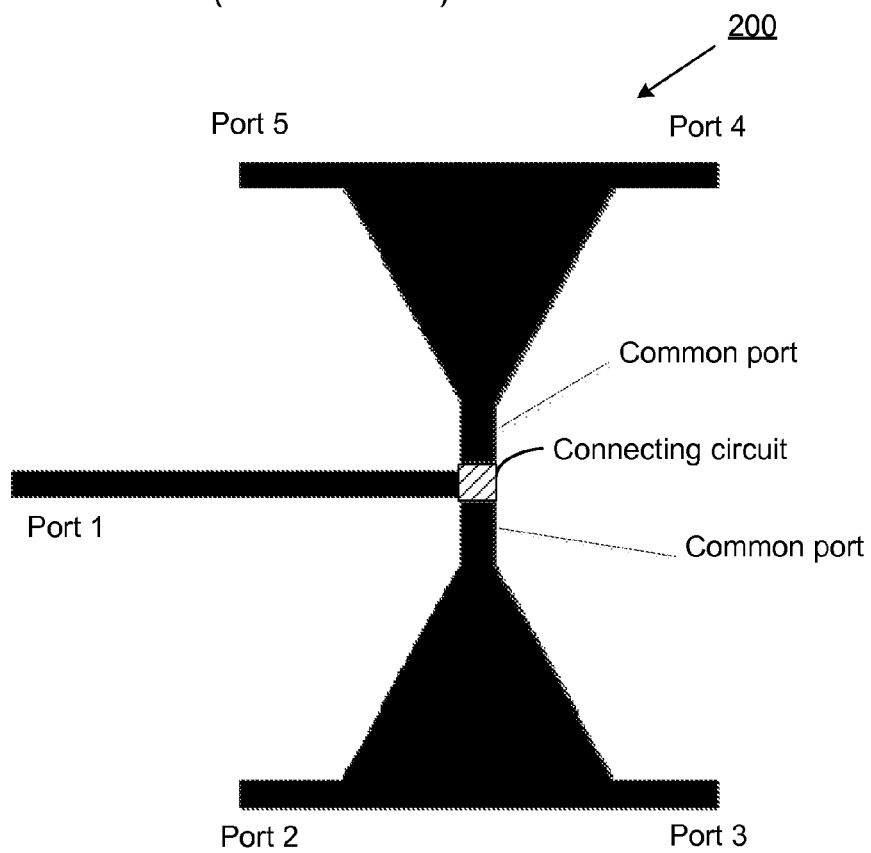

FIG. 2B shows a possible implementation of a 4-way radial power combiner with tapered line, the advantage of this configuration versus a conventional radial splitter/combiner, it can be broadband instead of being narrow band.

Figure 2C:
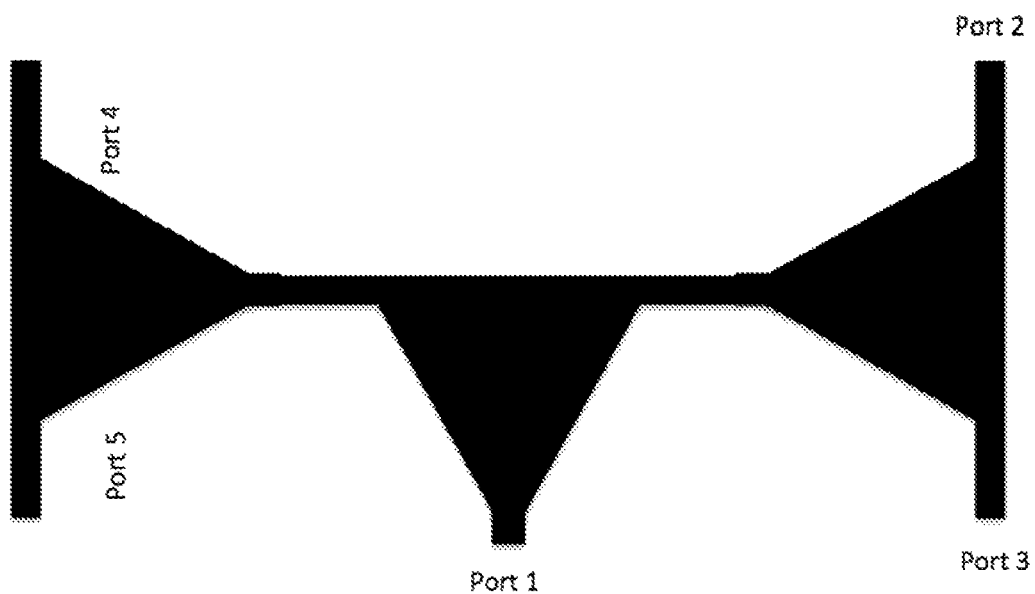
FIG. 2C presents a different inventive system including a 4-way power combiner/splitter with tapper lines in accordance with the present invention.

FIG. 2C presents a different implementation of the 1 to 4 ways. This implementation uses 3 taper combiners.

Figure 3:
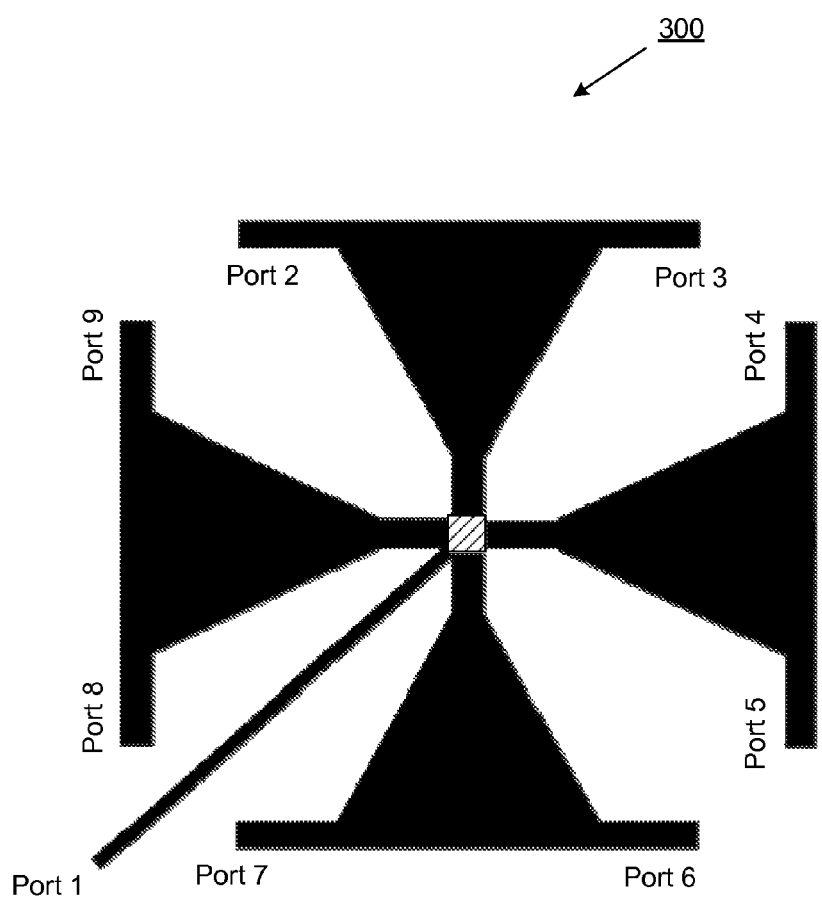
FIG. 3 depicts an inventive system including an 8-way radial power combiner/splitter with tapper line.

FIG. 3 shows an 8-way radial power combiner/splitter with tapered line. The feeding line with a first port (Port 1) can be on the same plane as the other ports or it can come from the bottom plane to feed in the middle of the N-way power combiner/splitter. In the circuit of FIG. 3, there are nine ports, which can be 1 to 8 in a divider application or 8 to 1 for a combiner application. In these configurations, the quarter-wavelength lines are designed in a taper way in order to match all the ports to the desired impedance, e.g., 50 Ohms. These N-way radial power combiners/splitters permit one to connect antennas to the ports in order to receive/transmit signals or any other devices e.g., power amplifiers (PA), low noise amplifiers (LNAs), oscillators, etc. These combiners/splitters have many advantages: e.g., they do not need additional components (resistors, inductors, capacitors, etc.) and therefore they can handle high power, have high isolation between the ports, and are inexpensive to fabricate. They can be fabricated on any substrate such as FR4, Duroid, laminate, ceramic, etc., and they present low passive intermodulation modulation (PIM). They also have a wide bandwidth of an octave and a half. It should be noted that any of the ports 1 to N/M (e.g., 1 to 8) can be connected to an antenna or to a transmit or receive port so as to create an N-input/M-output combiner/divider.

Active CPL Antenna

CPL antennas are the first commercially viable compound planar antennas that utilize both magnetic loop radiators and co-located electric field. In the CPL antenna, it is possible to implement a diode in the loop to change the impedance when the diode is placed in forward biased by changing its bias. It is also possible to put a variable capacitor in the loop to load it with different impedance. It can be a varactor, a digital capacitor or an array of capacitors that are commuted. A variable inductor can also be placed in the loop of the antenna to change its impedance. The remainder of this subsection provides a general overview of CPL antenna technology. The interested reader may refer to the cited references for additional information. It should be noted that the present applicant has developed a variety of configurations for CPL antennae, and the present invention is by no means limited to the specific examples described below.

As new generations of cellular phones and other wireless communication devices become smaller and embedded with increased applications, new antenna designs are required to address inherent limitations of these devices and to enable new capabilities. With conventional antenna structures, a certain physical volume is required to produce a resonant antenna structure at a particular frequency and with a particular bandwidth. However, effective implementation of such antennas is often confronted with size constraints due to a limited available space in the device.

Antenna efficiency is one of the important parameters that determine the performance of the device. In particular, radiation efficiency is a metric describing how effectively the radiation occurs, and is expressed as the ratio of the radiated power to the input power of the antenna. A more efficient antenna will radiate a higher proportion of the energy fed to it. Likewise, due to the inherent reciprocity of antennas, a more efficient antenna will convert more of a received energy into electrical energy. Therefore, antennas having both good efficiency and compact size are often desired for a wide variety of applications.

Conventional loop antennas are typically current fed devices, which generate primarily a magnetic (H) field. As such, they are not typically suitable as transmitters. This is especially true of small loop antennas (i.e. those smaller than, or having a diameter less than, one wavelength). The amount of radiation energy received by a loop antenna is, in part, determined by its area. Typically, each time the area of the loop is halved, the amount of energy which may be received is reduced by approximately 3 dB. Thus, the size-efficiency tradeoff is one of the major considerations for loop antenna designs.

Voltage fed antennas, such as dipoles, radiate both electric (E) and H fields and can be used in both transmit and receive modes. Compound antennas are those in which both the transverse magnetic (TM) and transverse electric (TE) modes are excited, resulting in performance benefits such as wide bandwidth (lower Q), large radiation intensity/power/gain, and good efficiency. There are a number of examples of two dimensional, non-compound antennas, which generally include printed strips of metal on a circuit board. Most of these antennas are voltage fed. An example of one such antenna is the planar inverted F antenna (PIFA). A large number of antenna designs utilize quarter wavelength (or some multiple of a quarter wavelength), voltage fed, dipole antennas.

Use of MIMO (multiple input multiple output) technologies is increasing in today's wireless communication devices to provide enhanced data communication rates while minimizing error rates. A MIMO system is designed to mitigate interference from multipath environments by using several transmit (Tx) antennas at the same time to transmit different signals, which are not identical but are different variants of the same message, and several receive (Rx) antennas at the same time to receive the different signals. A MIMO system can generally offer significant increases in data throughput without additional bandwidth or increased transmit power by spreading the same total transmit power over the antennas so as to achieve an array gain. MIMO protocols constitute a part of wireless communication standards such as IEEE 802.11n (WiFi), 4G, Long Term Evolution (LTE), WiMAX and HSPA+. However, in a configuration with multiple antennas, size constraints tend to become severe, and interference effects caused by electromagnetic coupling among the antennas may significantly deteriorate transmission and reception qualities. At the same time, efficiency may deteriorate in many instances where multiple paths are energized and power consumption increases.

In view of known limitations associated with conventional antennas, in particular with regard to radiation efficiency, a compound loop antenna (CPL), also referred to as a modified loop antenna, has been devised to provide both transmit and receive modes with greater efficiency than a conventional antenna with a comparable size. Examples of structures and implementations of the CPL antennas are described in U.S. Pat. No. 8,144,065, issued on Mar. 27, 2012, U.S. Pat. No. 8,149,173, issued on Apr. 3, 2012, and U.S. Pat. No. 8,164,532, issued on Apr. 24, 2012. Key features of the CPL antennas are summarized below with reference to the example illustrated in FIG. 18.

FIG. 18 illustrates an example of a planar CPL antenna 1800. In this example, the planar CPL antenna 1800 is printed on a printed circuit board (PCB) 1804, and includes a loop element 1808, which in this case is formed as a trace along rectangle edges with an open base portion providing two end portions 1812 and 1816. One end portion 1812 is a feed point of the antenna where the current is fed. The other end portion 1816 is shorted to ground. The CPL antenna 1800 further includes a radiating element 1820 that has a J-shaped trace 1824 and a meander trace 1828. In this example, the meander trace 1828 is configured to couple the J-shaped trace 1824 to the loop element 1808. The radiating element 1820 essentially functions as a series resonant circuit providing an inductance and a capacitance in series, and their values are chosen such that the resonance occurs at the frequency of operation of the antenna. Instead of using the meander trace 1828, the shape and dimensions of the J-shaped trace 1824 may be adjusted to connect directly to the loop element 1808 and still provide the target resonance.

Similar to a conventional loop antenna that is typically current fed, the loop element 1808 of the planar CPL antenna 1800 generates a magnetic (H) field. The radiating element 1820, having the series resonant circuit characteristics, effectively operates as an electric (E) field radiator (which of course is an E field receiver as well due to the reciprocity inherent in antennas). The connection point of the radiating element 1820 to the loop element 1808 is critical in the planar CPL antenna 1800 for generating/receiving the E and H fields that are substantially orthogonal to each other. This orthogonal relationship has the effect of enabling the electromagnetic waves emitted by the antenna to effectively propagate through space. In the absence of the E and H fields arranged orthogonal to each other, the waves will not propagate effectively beyond short distances. To achieve this effect, the radiating element 1820 is placed at a position where the E field produced by the radiating element 1820 is 90° or 270° out of phase relative to the H field produced by the loop element 1808. Specifically, the radiating element 1820 is placed at the substantially 90° (or) 270° electrical length along the loop element 1808 from the feed point 1812. Alternatively, the radiating element 1820 may be connected to a location of the loop element 1808 where current flowing through the loop element 1808 is at a reflective minimum.

In addition to the orthogonality of the E and H fields, it is desirable that the E and H fields are comparable to each other in magnitude. These two factors, i.e., orthogonality and comparable magnitudes, may be appreciated by looking at the Poynting vector (vector power density) defined by P=E×H (Volts/m×Amperes/m=Watts/m2). The total radiated power leaving a surface surrounding the antenna is found by integrating the Poynting vector over the surface. Accordingly, the quantity E×H is a direct measure of the radiated power, and thus the radiation efficiency. First, it is noted that when the E and H are orthogonal to each other, the vector product gives the maximum. Second, since the overall magnitude of a product of two quantities is limited by the smaller, having the two quantities (|H| and |E| in this case) as close as possible will give the optimal product value. As explained above, in the planar CPL antenna, the orthogonally is achieved by placing the radiating element 1820 at the substantially 90° (or 270°) electrical length along the loop element 1808 from the feed point 1812. Furthermore, the shapes and dimensions of the loop element 1808 and the radiating element 1820 can be each configured to provide comparable, high |H| and |E| in magnitude, respectively. Therefore, in marked contrast to a conventional loop antenna, the planar CPL antenna can be configured not only to provide both transmit and receive modes, but also to increase the radiation efficiency.

Size reduction can be achieved by introducing a series capacitance in the loop element and/or the radiating element of the CPL antenna. Such an antenna structure, referred to as a capacitively-coupled compound loop antenna (C2CPL), has been devised to provide both transmit and receive modes with greater efficiency and smaller size than a conventional antenna. Examples of structures and implementations of the C2CPL antennas are described in U.S. patent application Ser. No. 13/669,389, entitled "Capacitively Coupled Compound Loop Antenna," filed Nov. 5, 2012.

Logarithmic Detector Amplifier+Antenna

Another interesting configuration is to integrate the logarithmic detector amplifier (LDA) directly on the antenna. An innovative LDA circuit provided by the assignee of the present invention (DockOn Inc.) can perform various functions, some simultaneously: logarithmic detection and amplification, signal regeneration, frequency conversion, noise filtering, interference rejection, and analog/digital amplitude and frequency demodulation. These functions increase sensitivity and bandwidth, lower the power consumption, improve interference rejection and signal to noise ratios, and extend wireless range of digital and analog AM, FM, and PM inputs. The specific applications of LDA technology are numerous.

The combination of LDA/CPL antennas can greatly improve wireless communications, for example, for wireless local area network (WLAN) applications. An important limitation in wireless communication is the level of interference that can reduce severely the throughput and the wireless reach. This is probably one of the main limitations for Wi-Fi when deployed in residential areas where many wireless routers are present and none of them are synchronized (residence to residence). Each router is seen by the others as a rogue access point and this generates a significant level of interferences when in near proximity. Interference forces each router to back-off the data rate and reduce it to a lower level to maintain a minimum BER (bit error rate). More and more people have wireless routers, access points, repeaters, computers, tablets, cellphones, televisions, game consoles, etc. In addition, each neighbor has a similar setup in his house and therefore conflicts arise with all these nearby WLANs. This is due largely to interference cancellation of overlapping channels. This conflict reduces the bandwidth as the client gets farther from its router and closer to competing routers in neighboring WLANs. This LDA technology can be suitable for any wireless technology, e.g., LTE, WiMAX, etc. The LDA technology provided by DockOn Inc. can be synchronized on each client and its router to reduce or eliminate this cancellation, and thereby provide greater range and bandwidth between wireless routers and their clients. This is possible because the LDA provides a higher signal to noise ratio (SNR) and a higher sensitivity. WLAN, WAN, and Wi-Fi achieves superior receive sensitivity, interference cancellation, and bandwidth via 2 LDAs synchronized with the desired channel, CPL antennas, low IF conversion, and (in the case of digital input/output) replacement of the 2 ADCs by frequency to digital converters.

a. The LDA enhances the regenerative digital output of devices using quadrature phase shift keying (QPSK) modulation, which in turn reduces interference cancellation by improving discrimination between channels.

b. By using different antennas and tuning sections, the same wireless receiver technology can also receive and demodulate WLAN, XM satellite, and Wi-Fi signals.

c. The LDA uses a phase lock loop (PLL) circuit to find the best channel for the client-router to use, and filter out adjacent or overlapping channels using intensity differences and phase differentiation. The LDA with PLL can distinguish signals that are 6 dB stronger than interference, and 3 dB better than existing systems.

d. The conversion of an input signal to frequency modulation in the IF range, and the use of logarithmic decompression, is particularly effective at reducing noise and expands the dynamic range of weak signals with low s/n ratios—increasing the sensitivity and range (and decreasing the power usage) of splatter-prone radar; micro-signal medical devices like ultrasound, MRIs, and CAT scans; fish finders and sonar in general; and collision avoidance.

e. The ability of LDAs to filter random noise from weaker signals gives them the means to extract 10 dB of signal below the noise floor of the low-noise amplifiers now used to attenuate cellular output based on distance from cell stations. To further reduce the output power of cell phones, and thereby extend their battery life and range by 3×, LDA technology can be integrated directly into IC chips in the phone.

f. The LDA is the core of a high performance digital radio receiver solution for multiple active antennas, plus 11ac/MIMO and OFDM for higher data capacity. In such configurations, each CPL antenna has a high performance LDA-based receiver. When the LDA is connected to the antenna it helps the isolation between each antenna.

g. The LDA can also be implemented on electronically steerable antennas.

Figure 4A:
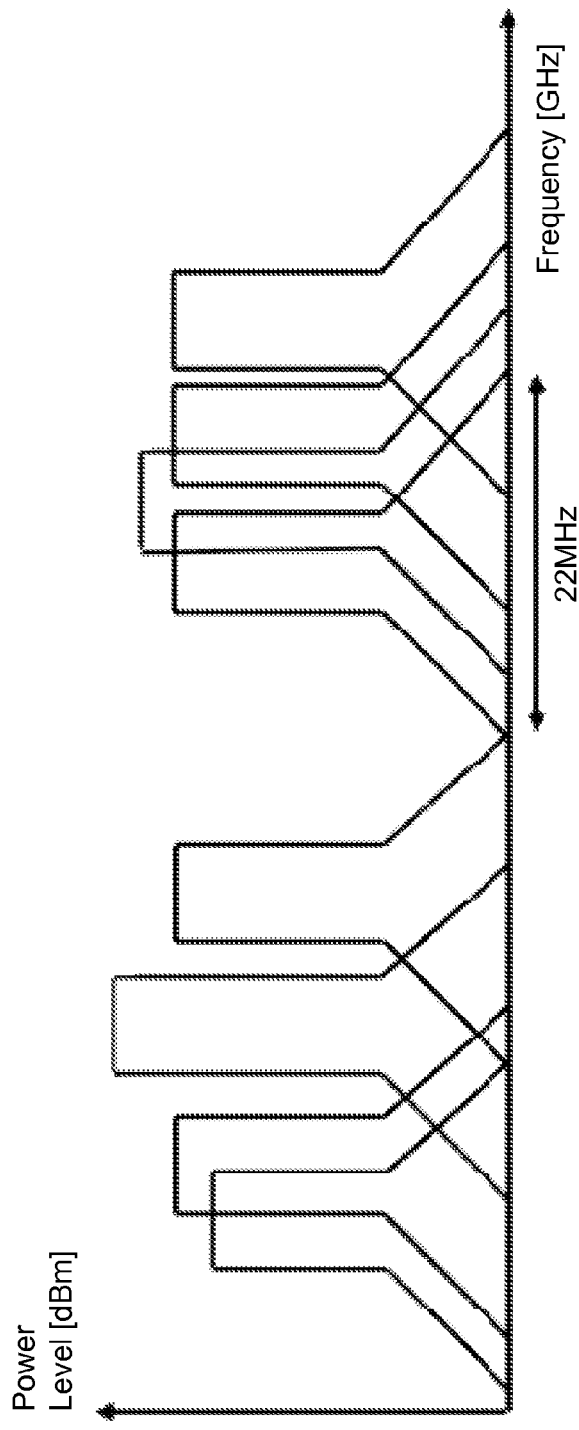
FIG. 4A is a graph of power level versus for a Wi-Fi 2.4-2.5 GHz spectrum.

FIG. 4A presents the power level vs. frequency for WIFI 802.11 where several OFDM signals may coexist or interfere (alternate or adjacent channels). LDA technology could help in every one of these situation when locked to the channel with a PLL and also help for co-channel interference since locked in phase with the master clock of the receiver and the other side desired transmitter (and out of phase with rogue access points).

Figure 4B:
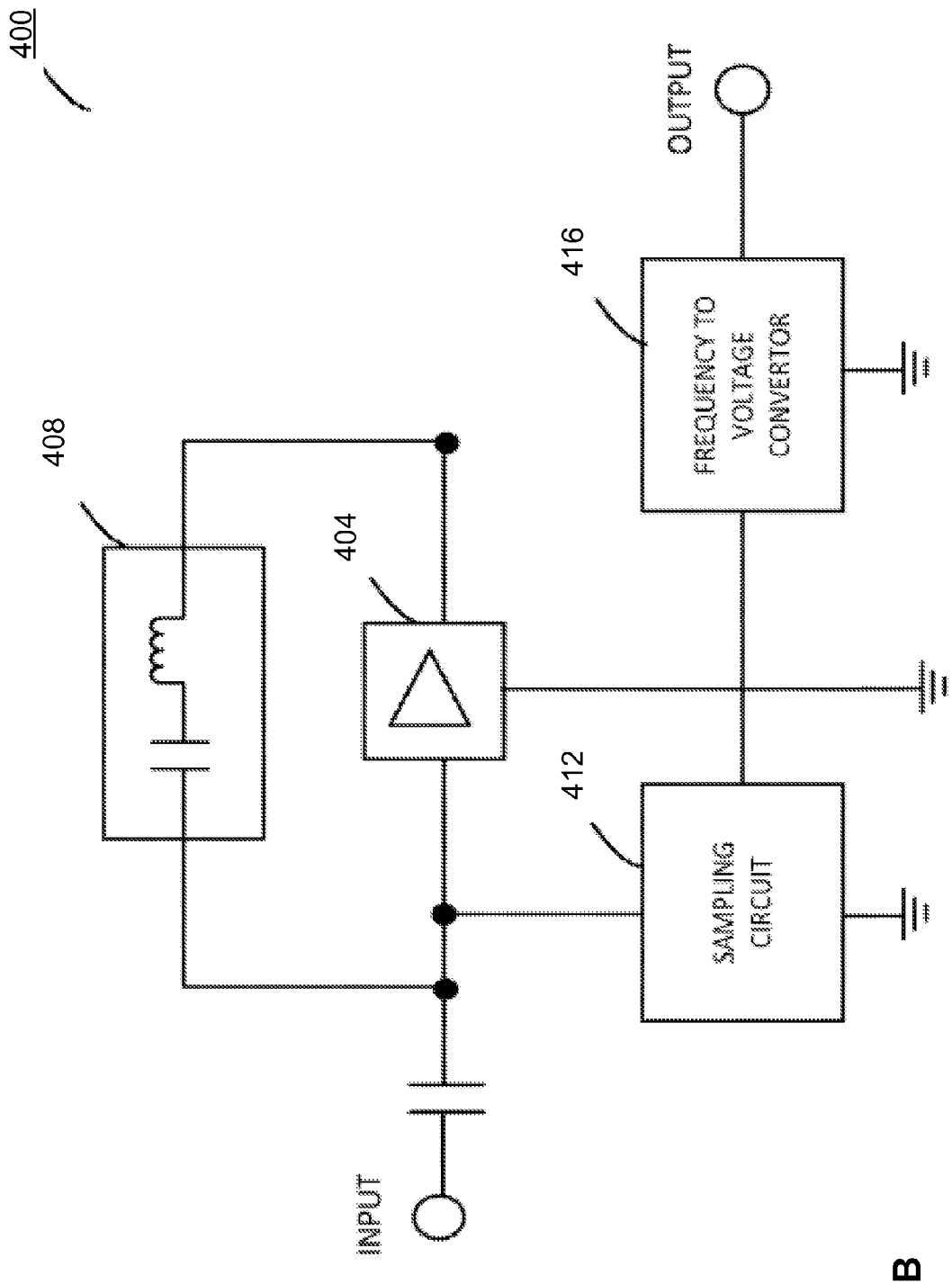
FIG. 4B is a block diagram illustrating an embodiment of a logarithmic detector amplifier (LDA).

A new type of logarithmic detector amplifier 400 will now be summarized with reference to FIG. 4B. Examples of structures and implementations of existing logarithmic detectors are described in U.S. Pat. No. 7,911,235, issued on Mar. 22, 2011, which is incorporated herein by reference.

In the illustrative embodiment of FIG. 4B, the input signal from the input terminal, labeled INPUT, may be received by an amplifying circuit 404. The amplifying circuit 404 may be configured to amplify the input signal and may include any suitable amplifying element, such as an operational amplifier, a bipolar junction transistor (BIT), a field-effect transistor (FET) or other discrete transistor, a vacuum tube, a RF amplifier, and the like. Oscillation may be initiated in the amplifying circuit 400 in response to electrical noise and/or a desired signal. The oscillation may be terminated periodically in response to the magnitude of the input signal. A resonant circuit 408, which may be configured to be a feedback circuit, may be coupled in parallel with the amplifying circuit 404 to control a frequency of operation. In the embodiment of FIG. 4B, the resonant circuit 408 may include a series LC circuit, wherein the L and C values may be selected to have a resonant frequency corresponding to the frequency of operation of the logarithmic detector 400. The oscillations may be set up in the amplifying circuit 404 at the frequency determined by the L and C values. Thus, noise outside of the LC resonance may have a minimal effect on the operation of the LC circuit. Input signals within the bandwidth of the LC resonance may commence oscillation more rapidly than random noise alone. The factor of merit or factor Q of the circuit may be determined mostly by the components used in the resonant circuit 408. A high-Q circuit may be achieved by use of a crystal resonator, for example, within the resonant circuit 408.

A sampling circuit 412 may be coupled to the amplifying circuit 404. The sampling circuit 412 may be configured to effectively sample the current flowing in the voltage supply line to the amplifying circuit 404; once a predetermined threshold is reached, the sampling circuit 412 may act to cease the oscillation. That is, the sampling circuit 412 may be used to periodically interrupt the oscillation each time when the threshold is reached. A frequency to voltage convertor 416 may be coupled to the sampling circuit 412. The input to the frequency to voltage convertor 416 may include a series of voltage spikes, the frequency of which may vary substantially as the logarithm of the power of the input signal. The OUTPUT from the frequency to voltage convertor 416 may be a DC voltage that is proportional to the frequency of the input spikes.

In the case where the input signal is modulated, the OUTPUT of the frequency to voltage converter 416 may include a DC voltage component and an AC voltage component. The AC component may correspond to the input modulation and effectively be a copy of the demodulated input signal in baseband.

Figure 5:
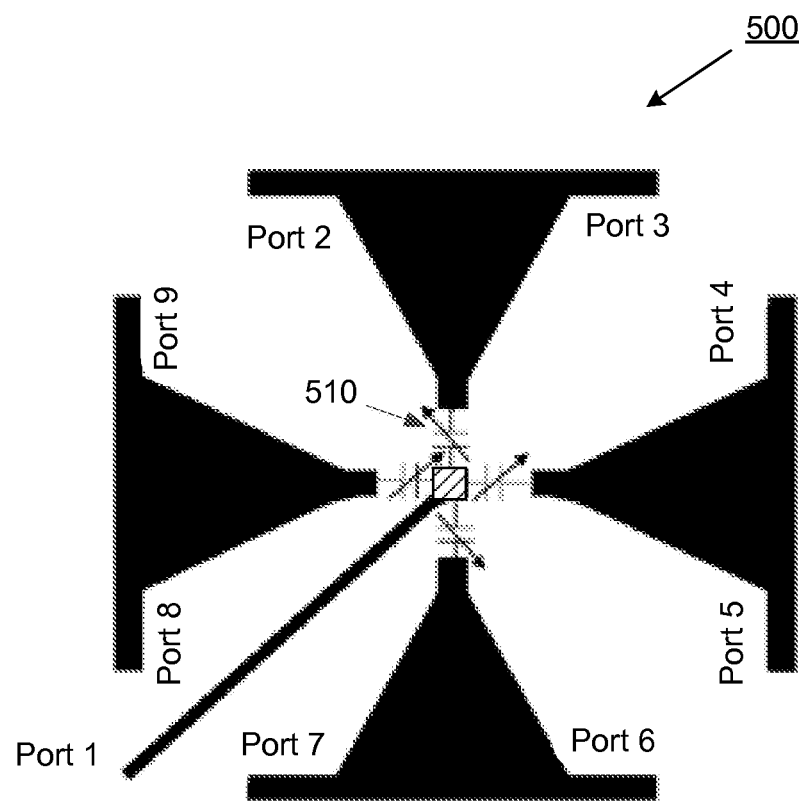
FIG. 5 depicts a system including an 8-way radial power combiner/splitter with series variable capacitors.

In accordance with the present invention, a variety of circuit configurations may be implemented based on the N-way radial combiner/splitter, e.g., where N=8 as shown in FIGS. 5-11. For example:

FIG. 5 illustrates a system including an 8-way radial power combiner/splitter 500 with series variable capacitors 510. In this way it is possible to optimize/maximize the transfer of power for from the input port to the output ports in a splitter configuration or from output ports to the input port in a combiner configuration. By using a variable component it is possible to adjust the splitter/combiner in real time.

Figure 6:
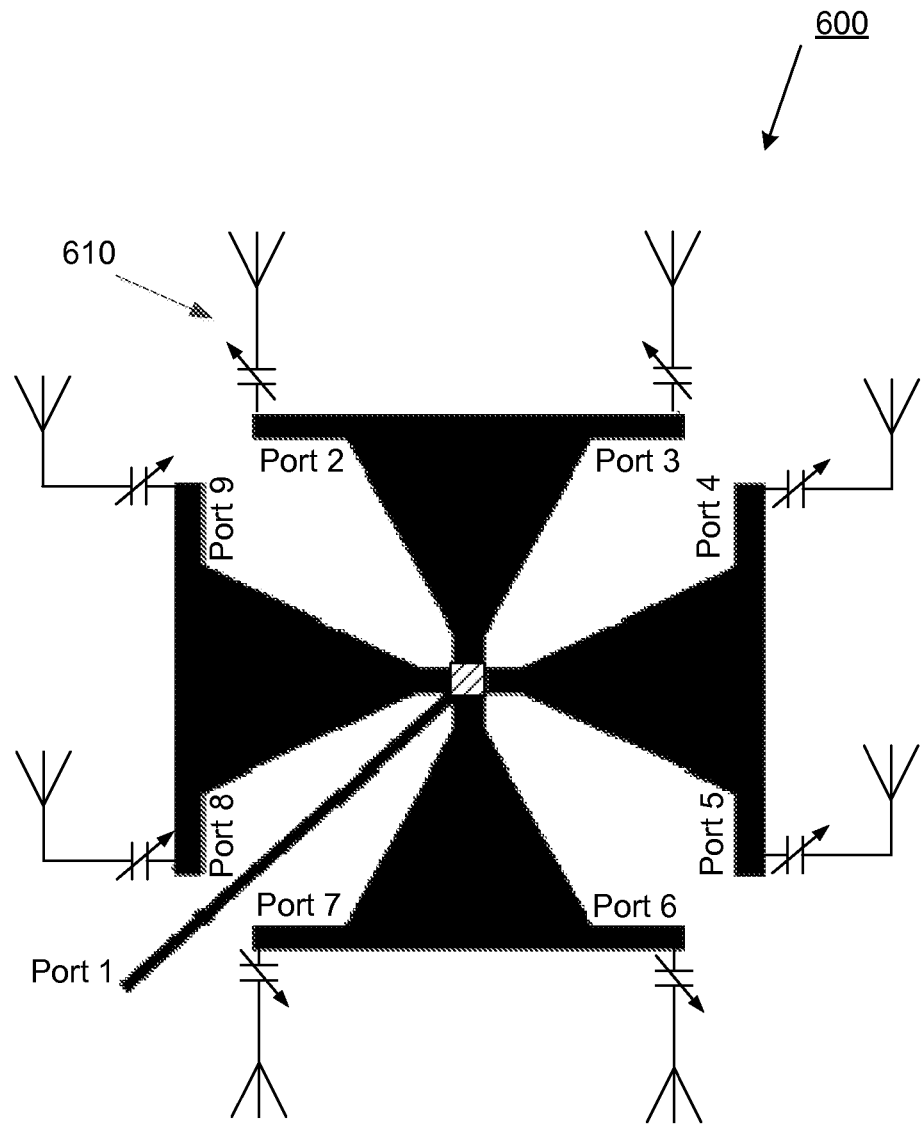
FIG. 6 depicts a system including an 8-way radial power combiner/splitter with antennas and series variable capacitors.

FIG. 6 illustrates a system including an 8-way radial power combiner/splitter 600 with antennas and series variable capacitors 610. By putting the variable component in series on each output port of the power splitter/combiner it is possible to vary the impedance of each port and the frequency when an antenna or any other device is connected. That solution is suitable when the antenna is detuned or affected by an outside factor loading it or detuning it. For example, someone put his hand, his head on in the vicinity on the antenna that happens frequently in a mobile device. Or in a fixed device when the power combiner/antenna is mount on a wall, or close to a metallic structure that will de-tuned and affect the antenna performances, it is possible to re-adjust it to obtain the best performances.

Figure 7:
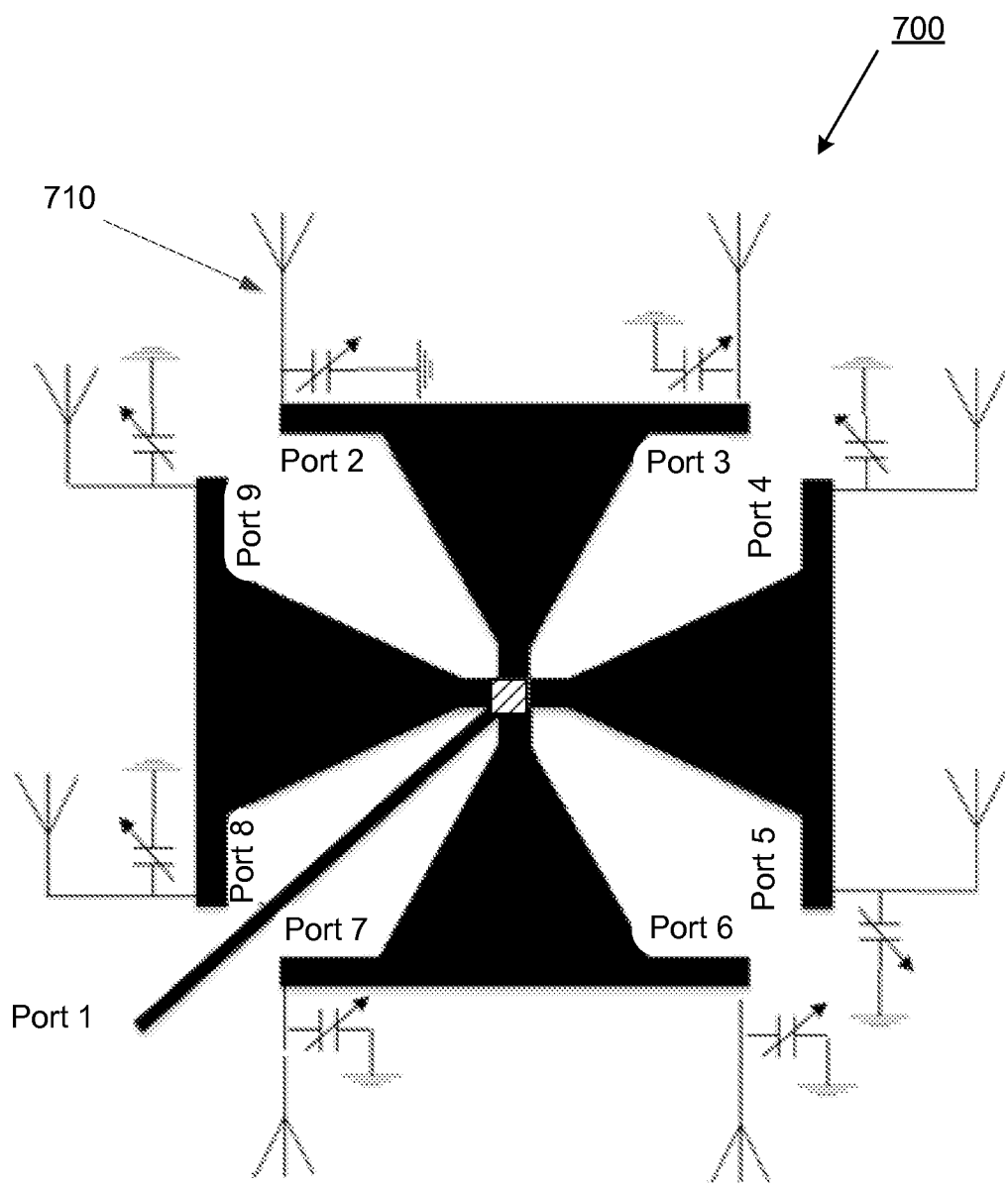
FIG. 7 depicts a system including an 8-way radial power combiner/splitter with antennas and shunt variable capacitors.

FIG. 7 illustrates a system including an 8-way radial power combiner/splitter 700 with antennas and shunt variable capacitors 710. By putting the variable component in shunt on each output port of the power splitter/combiner it is possible to vary the impedance of each port and the frequency when an antenna or any other device is connected. That solution is suitable when the antenna is detuned or affected by an outside factor loading it or detuning it. For example someone put his hand, his head on in the vicinity on the antenna that happens frequently in a mobile device. Or in a fixed device when the power combiner/antenna is mount on a wall, or close to a metallic structure that will de-tuned and affect the antenna performances, it is possible to re-adjust it to obtain the best performances.

Figure 8:
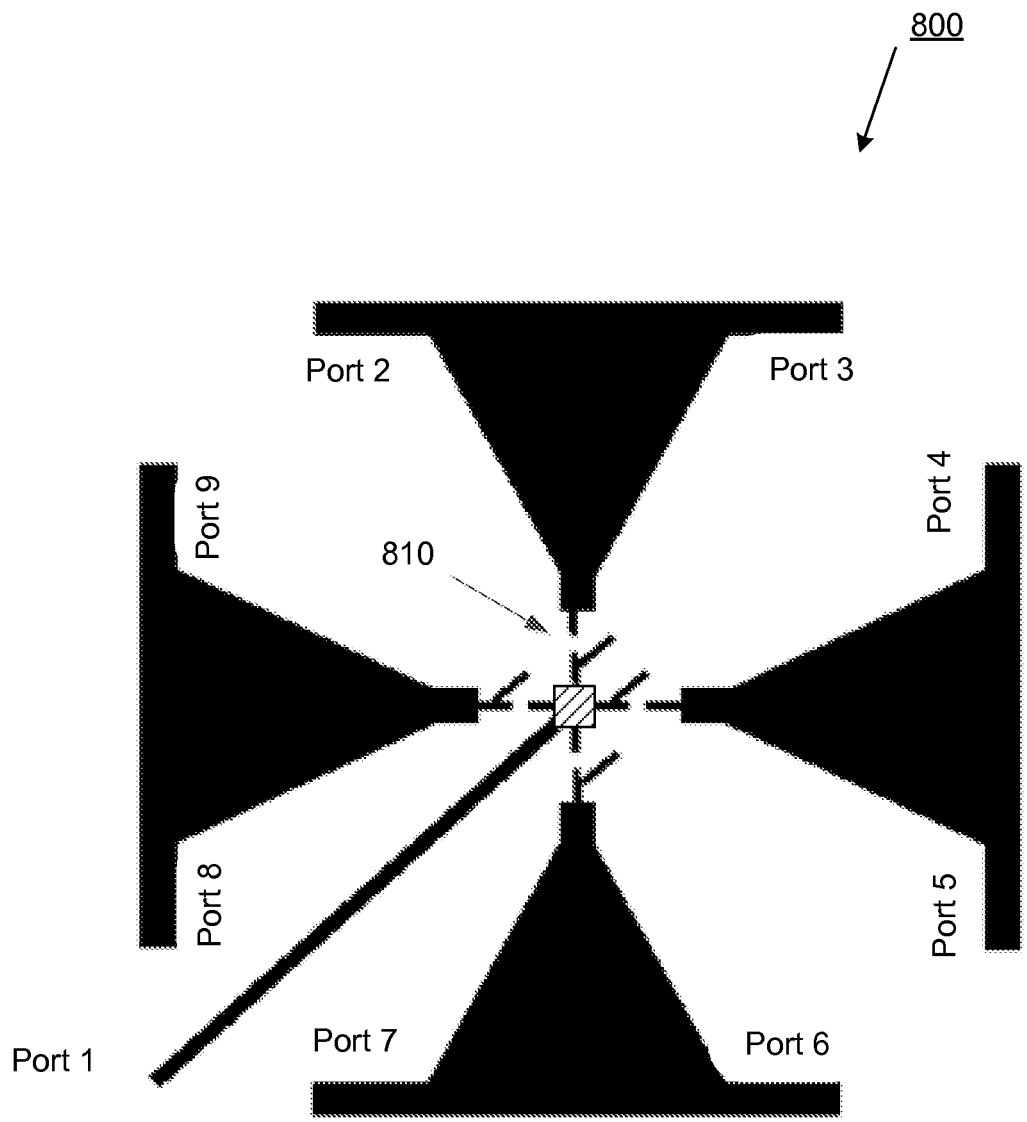
FIG. 8 depicts a system including an 8-way radial power combiner/splitter with electronic switches.

FIG. 8 illustrates a system including an 8-way radial power combiner/splitter 800 with switches 810, the switches can be RF switches, electronics, or any type of switches. The advantage of this architecture is that it is possible to turn ON and OFF the branches that are not used and therefore maximize the transfer of power to only the operated branches, This can be very interesting for null steering and beam steering applications.

Figure 9A:
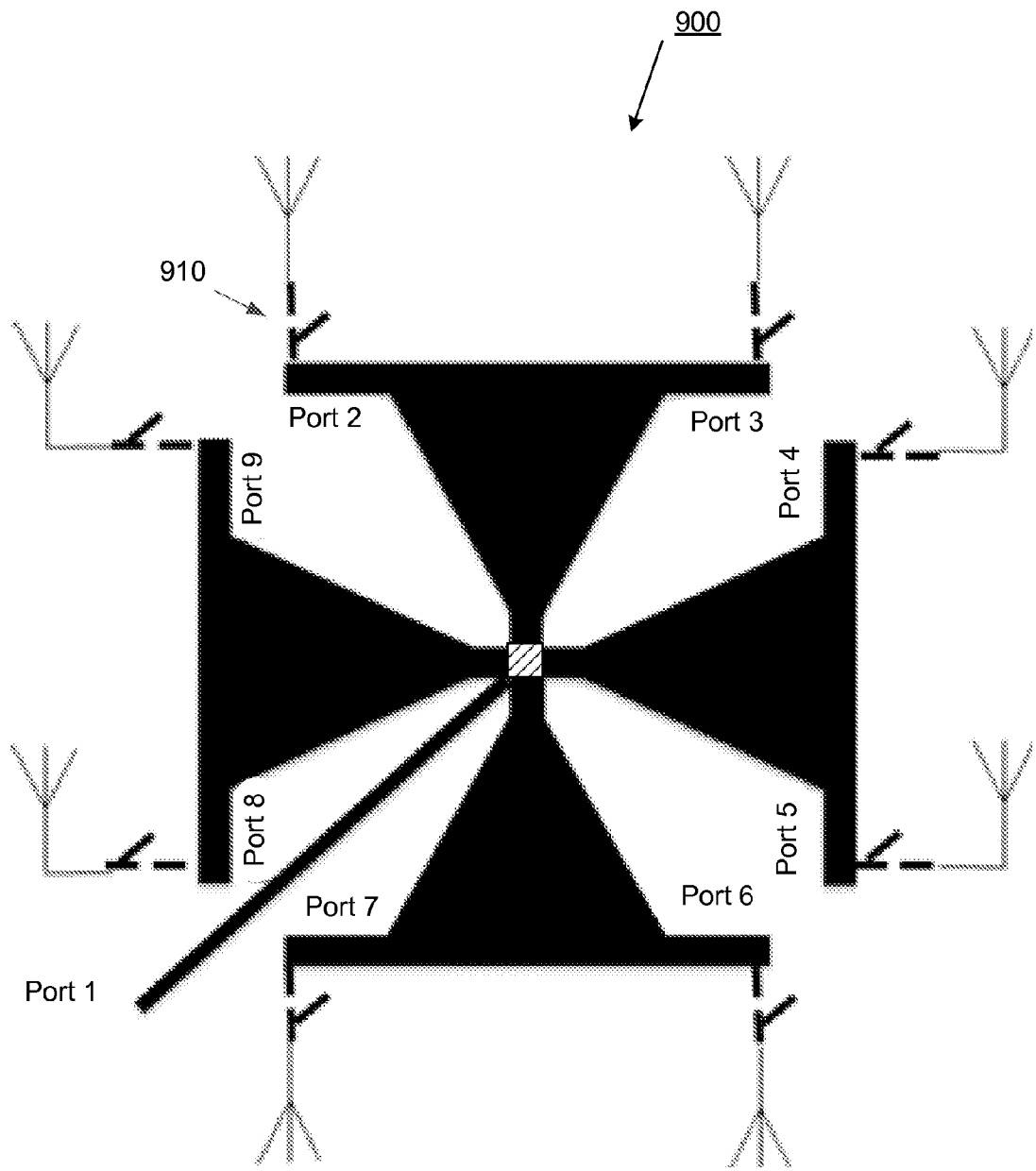
FIG. 9A depicts a system including an 8-way radial power combiner/splitter with antennas and switches.

FIG. 9A illustrates a system including an 8-way radial power combiner/splitter 900 with antennas and switches 910. The switches can be RF switches, electronics, or any type of switches. The advantage of this architecture is that it is possible to turn ON and OFF the antennas that are not used and therefore maximizing the transfer of power to the only operated antennas, This can be very interesting for null steering, beam steering applications.

Figure 9B:
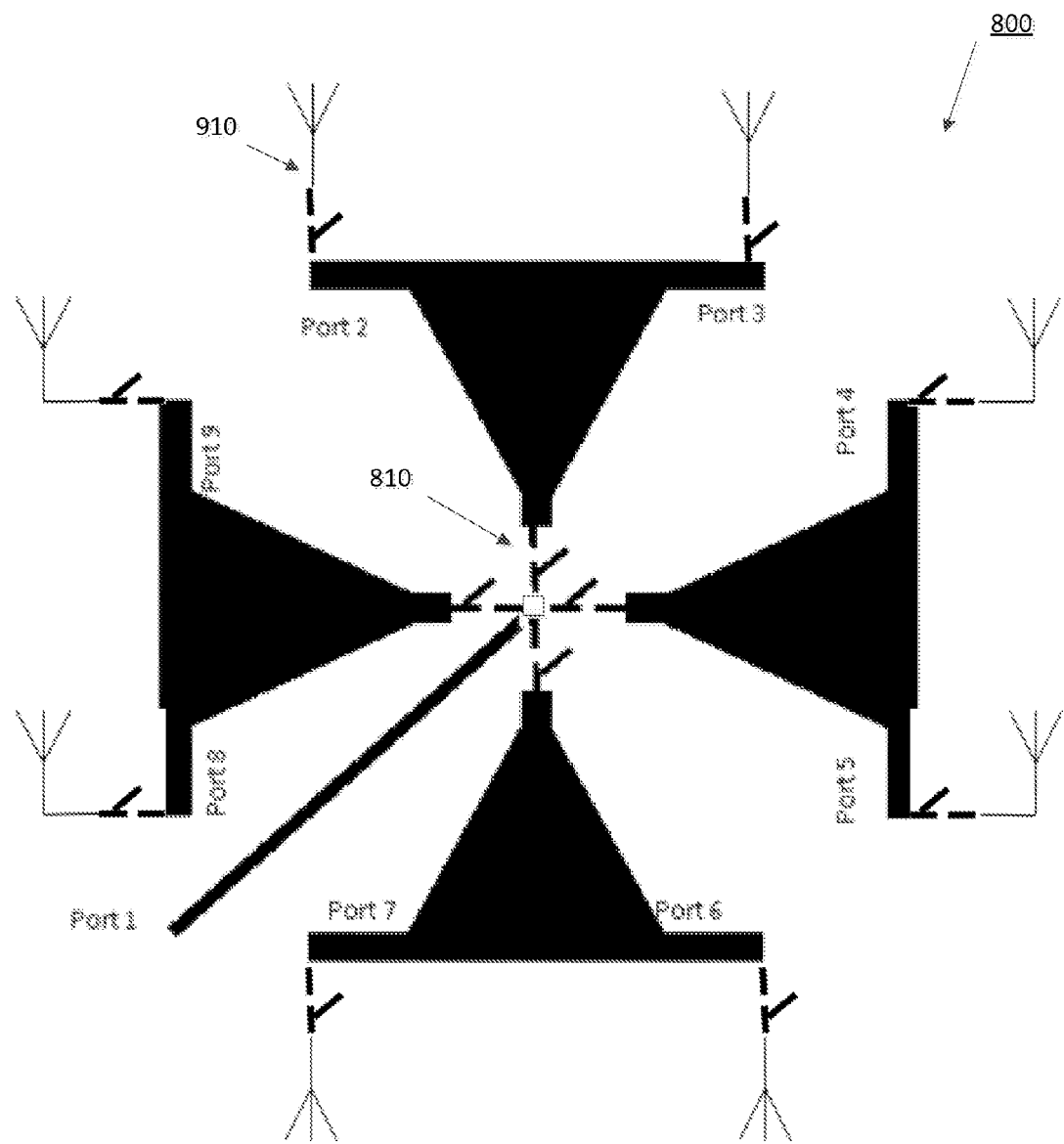
FIG. 9B presents an architecture combining the advantages of FIGS. 8 and 9A.

FIG. 9B presents an architecture combining the advantages of FIG. 8 and FIG. 9A. The switch 810 can turn ON and OFF each branch of the power combiner/splitter in order to have a better RF transformation from the input port to the output ports in a splitting scheme or from output to input in a combining scheme. In this configuration the antennas can be turn ON and OFF for maximum performances and maximum power transfer.

Figure 10:
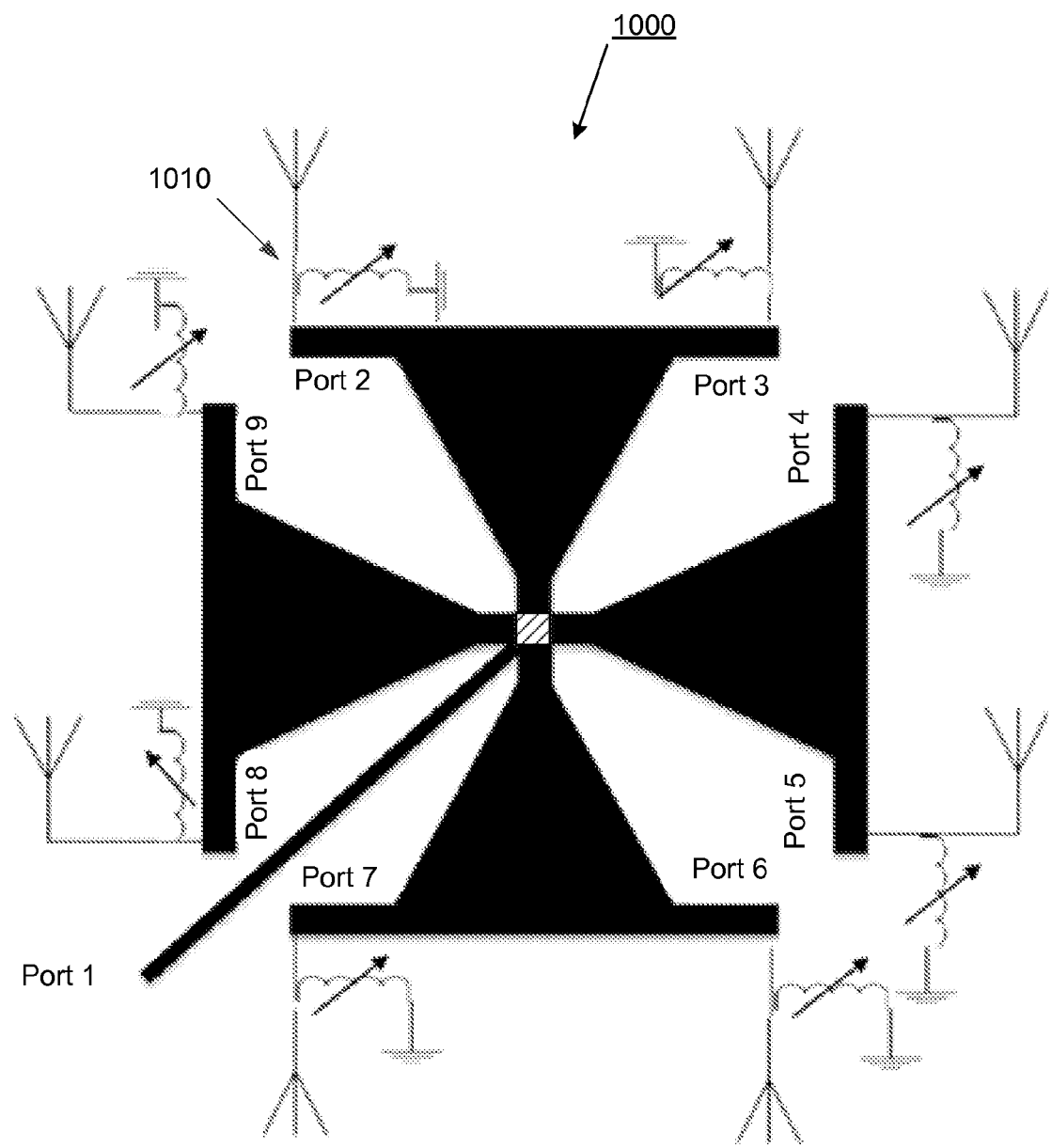
FIG. 10 depicts a system including an 8-way radial power combiner/splitter with antennas and variable inductors.

FIG. 10 depicts another system including an 8-way radial power combiner/splitter 1000 with antennas and variable inductors 1010. By putting the variable component in shunt on each output port of the power splitter/combiner, it is possible to vary the impedance of each port and the frequency when an antenna or any other device is connected. That solution is suitable when the antenna is detuned or affected by an outside factor loading it or detuning it. For example someone put his hand, his head on in the vicinity on the antenna that happens frequently in a mobile device. Or in a fixed device when the power combiner/antenna is mount on a wall, or close to a metallic structure that will de-tuned and affect the antenna performances, it is possible to re-adjust it to obtain the best performances. It is also possible to have a combination of variable inductors and variable capacitors to have more tuning range.

Figure 11:
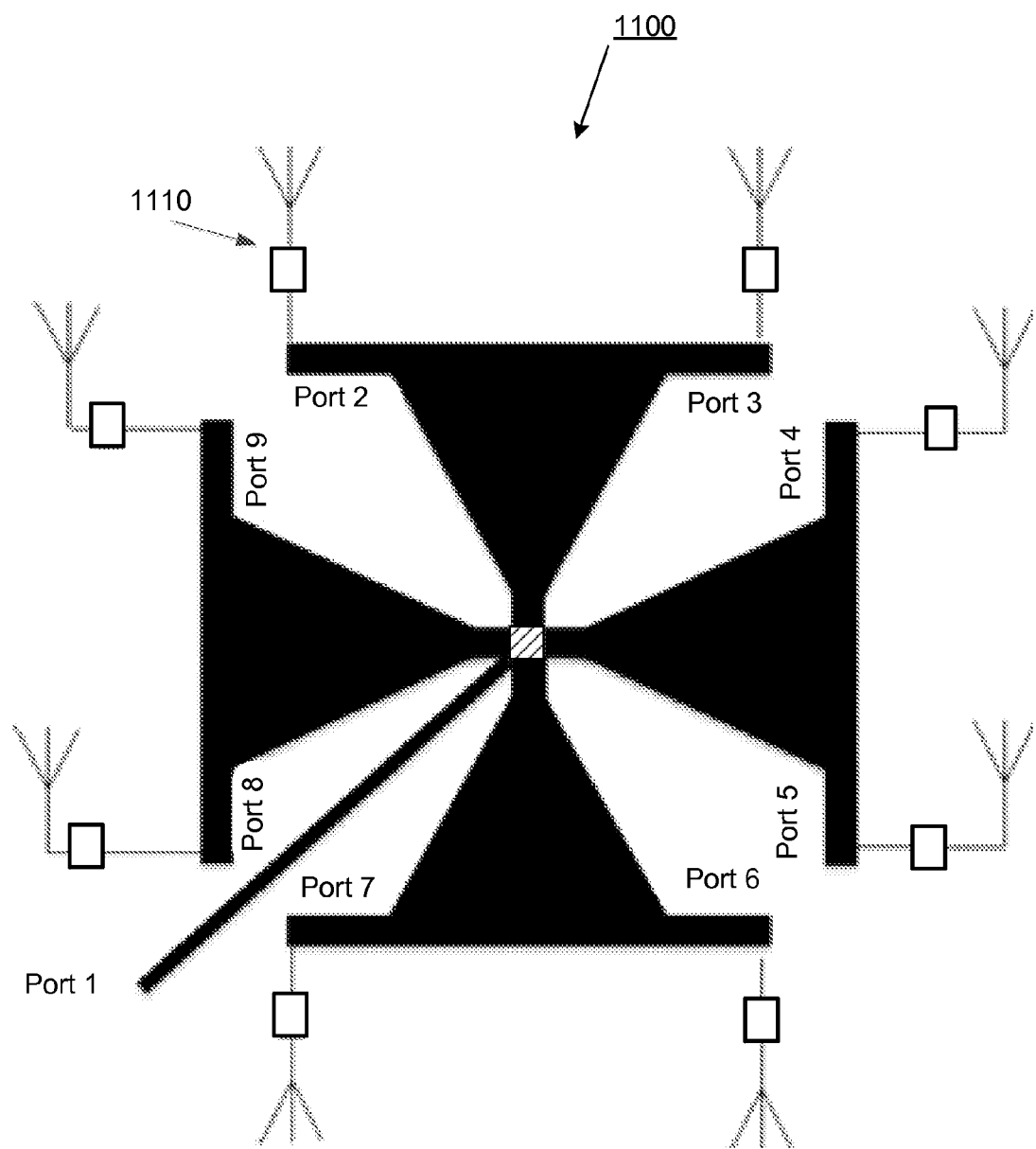
FIG. 11 depicts a system including an 8-way radial power combiner/splitter with receive antennas and a logarithmic detector amplifier (LDA) on each antenna.

FIG. 11 illustrates a system including an 8-way radial power combiner/splitter 1100 with receive antennas and a logarithmic detector amplifier (LDA) 1110 on each antenna. By designing the antenna, e.g., a CPL antenna and the LDA together, the impedance can be optimized for maximum RF transfer and improve the overall receive chain by more than 6 dB. The LDA can also be designed in a bi-directional that it is to say that it is possible to transmit and receive with the same device. Or the LDA can be used as a pure transmitter.

Another implementation, not shown in the figures but apparent to those skilled in the art, is to combine the different architectures presented in FIGS. 5, 6, 10, and 11 to obtain the best performance, efficiency, sensitivity, and selectivity. Any combination of the above configurations may be implemented.

It should be noted that the present invention is by no means limited to the specific embodiments shown in FIGS. 5-11.

Figure 12:
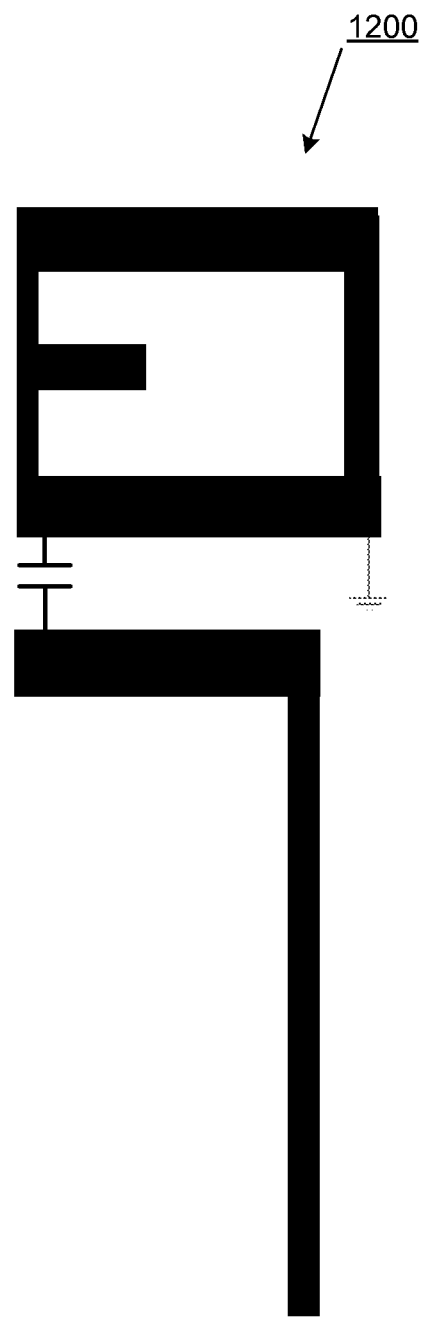
FIG. 12 depicts an electronic circuit including a fixed capacitor instead of a coupling gap.

FIG. 12 depicts a compound loop (CPL) antenna, also known as a C2CPL antenna, including a fixed capacitor instead of a coupling gap in a CPL/C2CPL antenna. By using a fixed capacitor value it is possible to reduce the size of the coupling RF input port. And to also provide a small tuning range when the antenna is fabricated, it is possible to change capacitor value to optimize the antenna. With a conventional implementation without the coupling capacitor it is not possible to physically change the coupling gap once the antenna has been fabricated.

Figure 13:
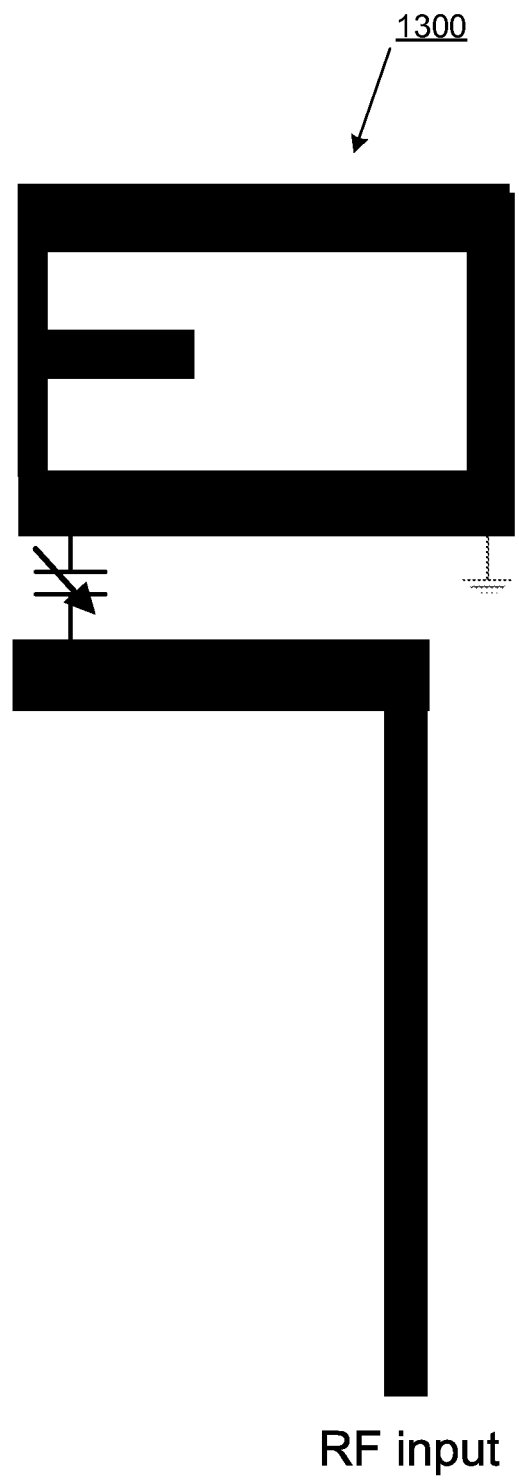
FIG. 13 depicts an electronic circuit including a variable capacitor instead of a coupling gap.

FIG. 13 presents a CPL antenna also known as a C2CPL antenna including a variable capacitor instead of a coupling gap. In this configuration, it is possible to change the value of the capacitance through the variable capacitor. It is therefore possible to change the RF input coupling to the antenna. This can be useful when the antenna is mounted in a device, since after implementation it is possible to re-adjust the antenna to remedy any outside de-tuning.

Figure 14:
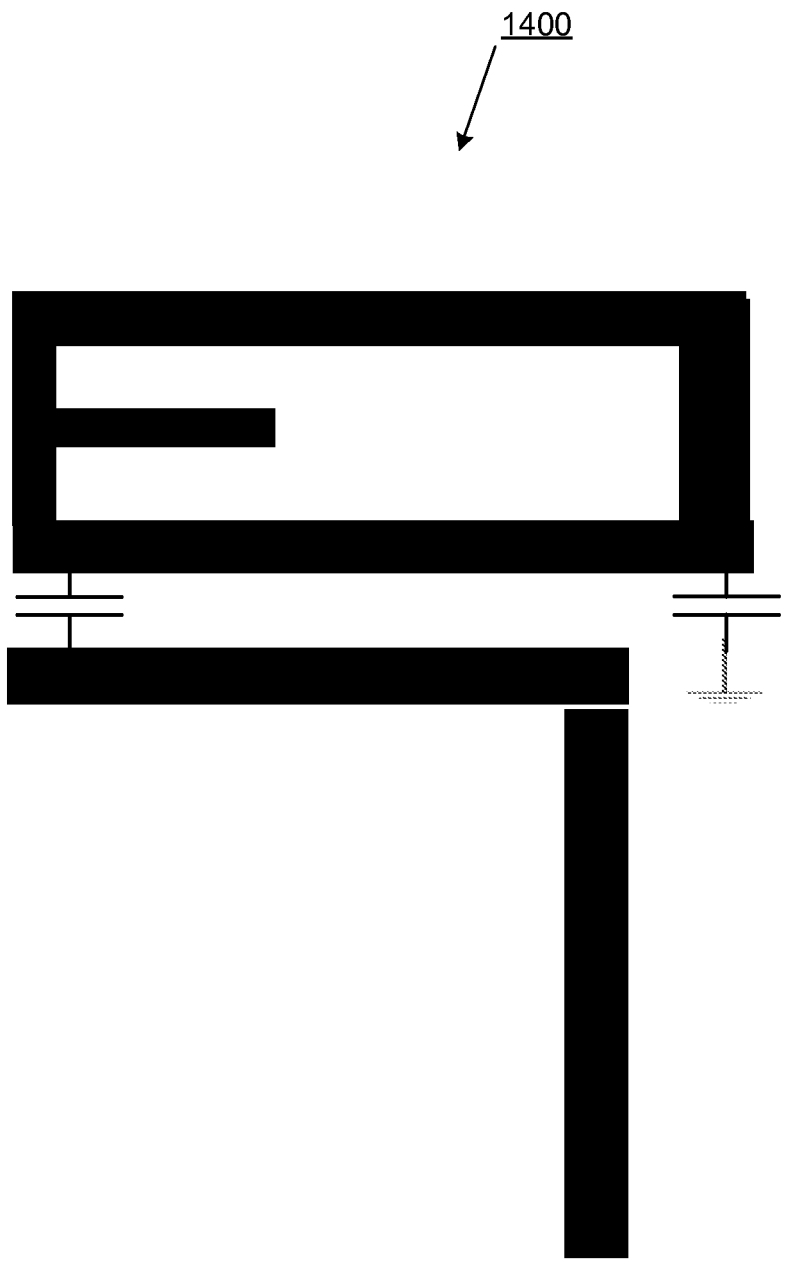
FIG. 14 depicts an electronic circuit including a fixed capacitor instead of a coupling gap as well as a capacitor to ground.

FIG. 14 depicts a CPL antenna also known as a C2CPL antenna including a fixed capacitor instead of a coupling gap as well as a capacitor to ground. By using a fixed capacitor, it is possible to reduce the size of the coupling RF input port by providing a small tuning range when the antenna is fabricated, and it is possible to change the capacitance value to optimize the antenna. With a conventional implementation without the coupling capacitor it is not possible to physically change the coupling gap once the antenna has been fabricated. The same by decoupling the ground, when the antenna is fabricated it is possible to modify some of its parameters. And it is possible to re-tune the antenna in band.

Figure 15:
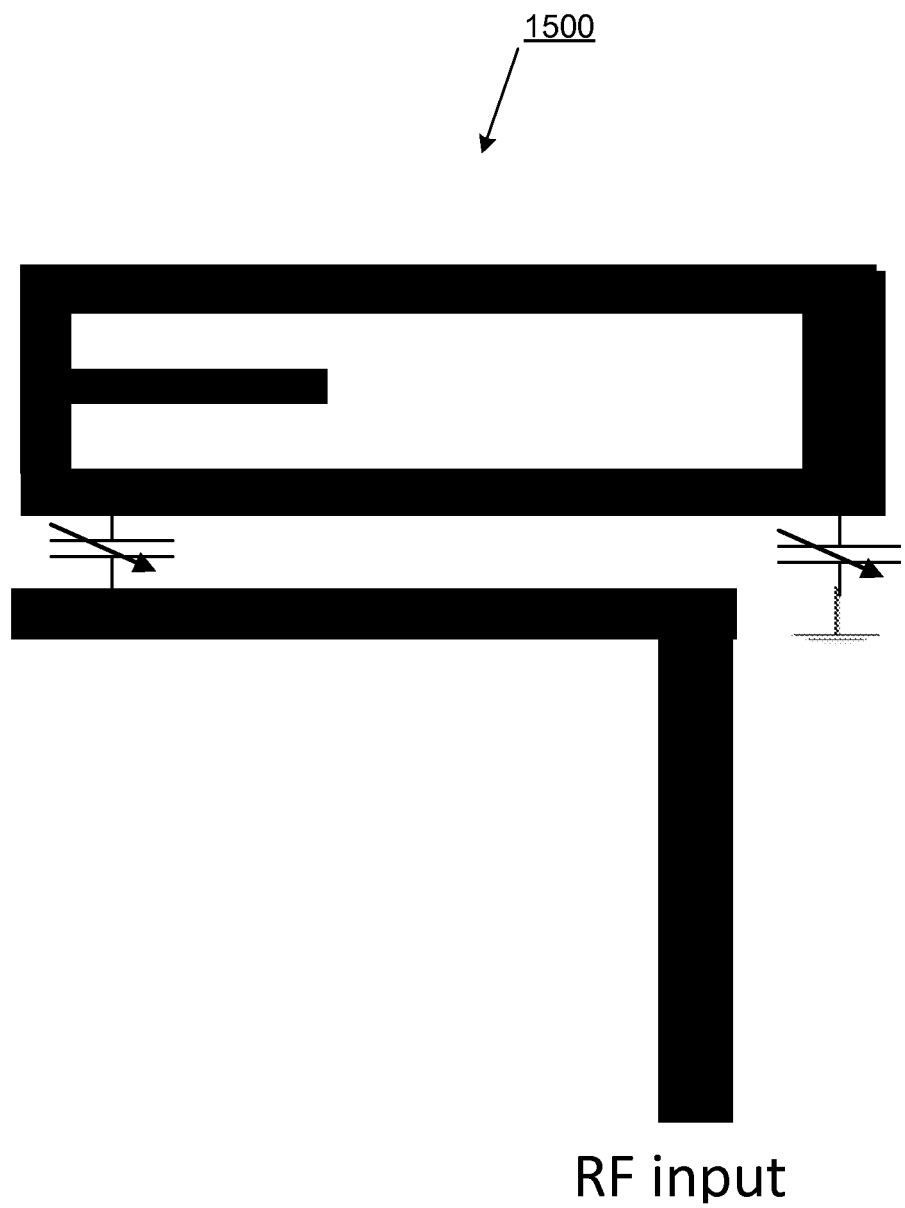
FIG. 15 depicts an electronic circuit including a variable capacitor instead of a coupling gap as well as a variable capacitor to ground.

FIG. 15 presents a CPL antenna also known as a C2CPL antenna including a variable capacitor instead of a coupling gap as well as a variable capacitor to ground. By using a variable capacitor value it is possible to reduce the size of the coupling RF input port by providing some tuning range when the antenna is fabricated, and in this configuration it is possible to change the capacitance value to optimize the antenna. With a conventional implementation without the coupling capacitor it is not possible to physically change the coupling gap once the antenna has been fabricated. The same by decoupling the ground, when the antenna is fabricated it is possible to modify some its parameters. With these variable capacitors it is possible to re-tune the antenna in band.

Figure 16:
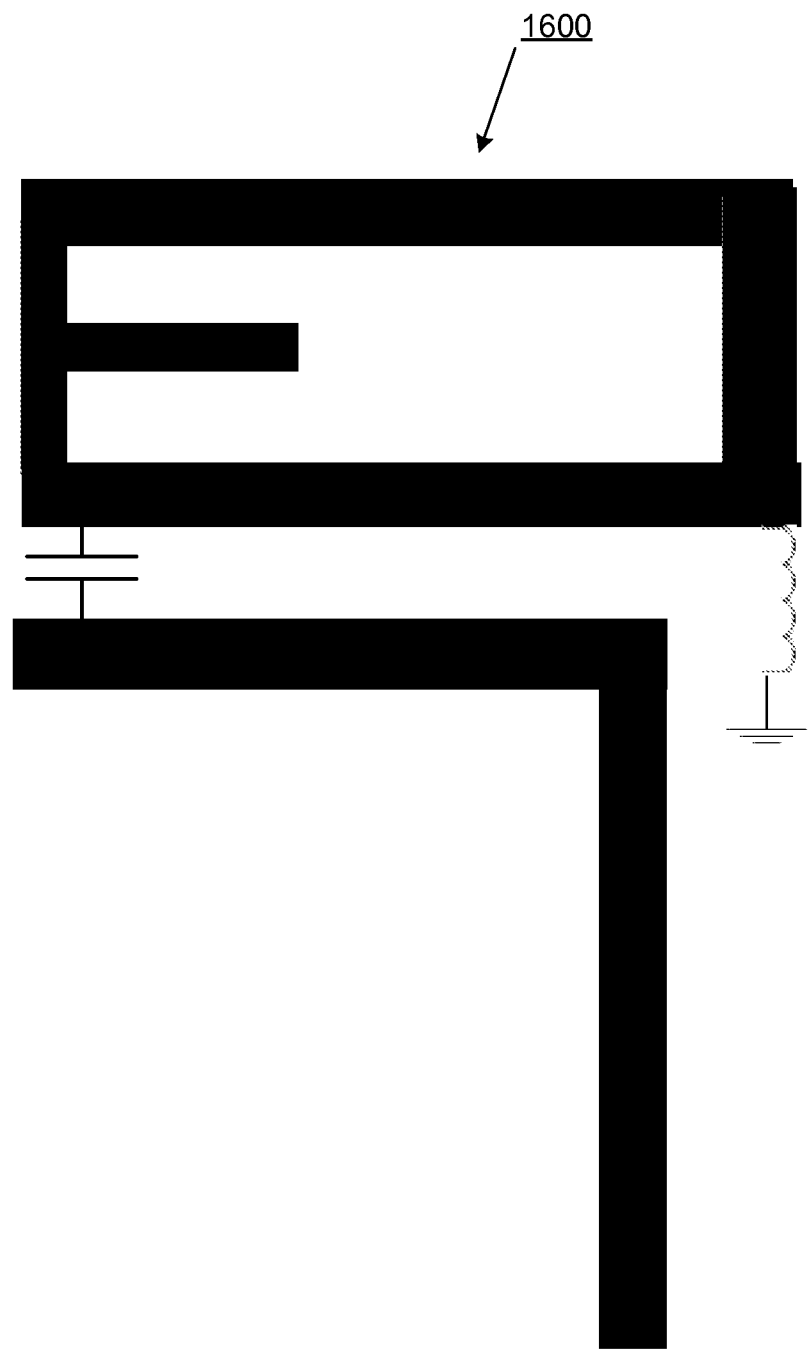
FIG. 16 depicts an electronic circuit including a fixed capacitor instead of a coupling gap and a fixed inductor to ground.

FIG. 16 shows a CPL antenna also known as a C2CPL antenna for coupling the RF input power instead of a coupling gap in a CPL/C2CPL antenna. By using a fixed capacitor it is possible to reduce the size of the coupling RF input port. And to also provide a small tuning range when the antenna is fabricated, it is possible to change capacitor value to optimize the antenna. With a conventional implementation without the coupling capacitor it is not possible to physically change the coupling gap once the antenna has been fabricated. The fixed inductor to ground provides more tuning capability by extending the loop.

Figure 17:
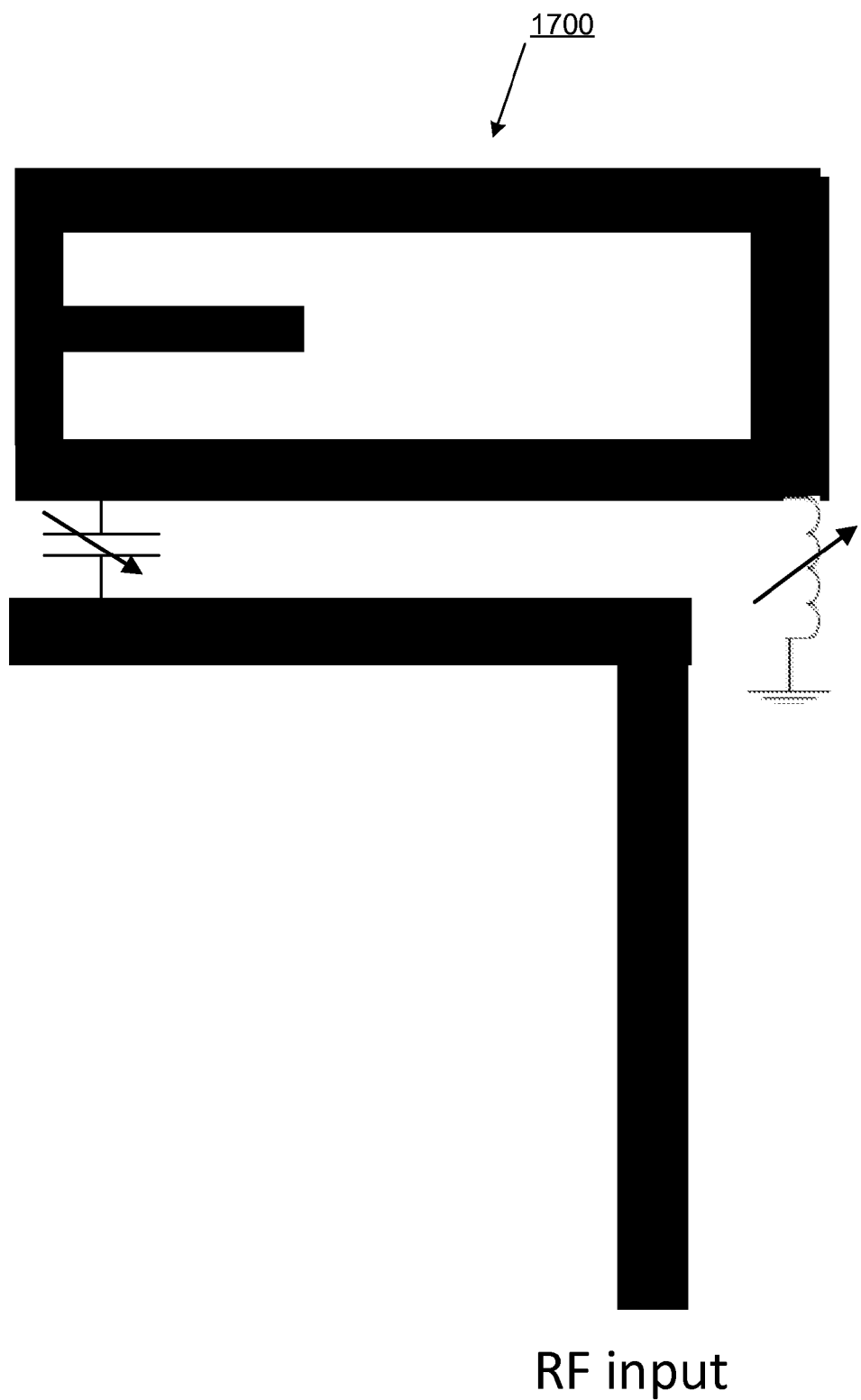
FIG. 17 depicts an electronic circuit including a variable capacitor instead of a coupling gap and a variable inductor to ground.

FIG. 17 presents a CPL antenna also known as a C2CPL antenna including a variable capacitor instead of a coupling gap as well as a variable inductor to ground. By using a variable capacitor value it is possible to reduce the size of the coupling RF input port by providing some tuning range when the antenna is fabricated, in this configuration it is possible to change the capacitor value to optimize the antenna. With a conventional implementation without the coupling capacitor it is not possible to physically change the coupling gap once the antenna has been fabricated. The same by decoupling the ground, when the antenna is fabricated it is possible to modify some its parameters. With these variable capacitors it is possible to re-tune the antenna in band.

CONCLUSION

Embodiments of the invention find particular use in Radio Frequency (RF) devices operable over multiple bands. It is quite common to offer cellular telephones that operate on multi-bands and by use of an embodiment of the present invention, different antennas can be provided (one for each band) and they can be connected via a divider to a single radio transceiver. The frequency of operation of devices according to embodiments of the invention will generally be in the range of a few kilohertz (kHz) to over a few terahertz (THz), and used with wireless telephony and wireless data access devices. Other uses in a range of fields will be apparent to the skilled person.

Attention is directed to all papers and documents which are filed concurrently with or previous to this specification in connection with this application and which are open to public inspection with this specification, and the contents of all such papers and documents are incorporated herein by reference. All of the features disclosed in this specification (including any accompanying claims, abstract and drawings), and/or all of the steps of any method or process so disclosed, may be combined in any combination, except combinations where at least some of such features and/or steps are mutually exclusive. Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed:

1. A system, comprising:
an N-way radio frequency (RF) divider/combiner comprising an input port electrically coupled to a first 2-way divider/combiner and a second 2-way divider/combiner; and
a third 2-way divider/combiner coupled to the input port and each of the first and second 2-way divider/combiners, wherein each 2-way divider is configured to receive electrical energy at a first, common port and guide said electrical energy to second and third ports, and wherein the second and third ports are separated by a generally rectangular bridge bar having a width selected to match the impedance of one or more devices to be connected to the second and third ports, respectively, and a length selected to provide a separation between the two ports of substantially ¼ wavelength at a center point of an operational frequency of the system.

2. The system of claim 1, wherein the connecting circuit is electrically coupled to the input port and to the first, common port of the first and second 2-way dividers.

3. The system of claim 2, further comprising an antenna electrically coupled to at least one port of the N-way divider.

4. The system of claim 3, wherein said antenna is a compound printed loop (CPL) antenna.

5. The system of claim 4, wherein all of the ports of the N-way RF divider are capable of being connected to an antenna or to an electrical circuit or component.

6. The system of claim 5, wherein the N-way RF divider is configured to provide N inputs and M output ports, wherein N and M are integers and any of the M output ports and N input ports can be connected to any combinations of: antenna, a CPL antenna, RF receive port, transmit port, amplifier, RF switch, low noise amplifier (LNA), oscillator, tuning circuit, matching circuit, lumped element circuit, active circuit, diode, adjustable inductive circuit, and adjustable capacitive circuit.

7. The system of claim 6, wherein each of the M output ports of the N-way RF divider are coupled to a CPL antenna.

8. The system of claim 7, wherein at least one of the CPL antennas is configured to have adjustable properties, and to be a passive antenna, a passive and adjustable antenna, or an active antenna.

9. The system of claim 8, further comprising an RF switch connected between a first output port of the N-way RF divider and an antenna coupled to said first output port.

10. The system of claim 9, wherein an RF switch is connected between each output port and the corresponding antenna connected to the output port, wherein the system is configured to selectively shape the overall radiating pattern of the combination of RF antennas.

11. The system of claim 1, wherein the N-way RF divider supports a bandwidth of approximately an octave and a half.

12. The system of claim 1, wherein there is a 30 dB isolation between each of the second and third ports of the first 2-way divider/combiner and the second and third ports of the second 2-way divider/combiner.

13. The system of claim 1, wherein the third 2-way divider combiner is electrically coupled to the input port and the first, common port of each of the first and second 2-way dividers.

14. The system of claim 1, wherein the first, common port is coupled to the bridge bar by a generally tapering microstrip section having a relatively thinner end and a relatively wider end, the relatively thinner end connected to the first, common port and the relatively wider end connected along a part of the length of the bridge bar, the generally tapering microstrip section providing a separation between the first, common port and each of the second and third ports of substantially ¼ wavelength at the center point.

15. A system, comprising:
an N-way radio frequency (RF) divider comprising an input port electrically coupled to a plurality of 2-way dividers, wherein the N-way RF divider is configured to provide N inputs and M output ports, wherein N and M are integers; and
wherein each 2-way divider is configured to receive electrical energy at a first, common port and guide said electrical energy to second and third ports, and wherein the second and third ports are separated by a generally rectangular bridge bar having a width selected to match the impedance of one or more devices to be connected to the second and third ports, respectively, and a length selected to provide a separation between the two ports of substantially ¼ wavelength at a center point of an operational frequency of the system; and
wherein the first, common port is coupled to the bridge bar by a generally tapering microstrip section having a relatively thinner end and a relatively wider end, the relatively thinner end connected to the first, common port and the relatively wider end connected along a part of the length of the bridge bar, the generally tapering microstrip section providing a separation between the first, common port and each of the second and third ports of substantially ¼ wavelength at the center point.

16. A system as recited in claim 15, further comprising a connecting circuit electrically coupled to the input port of two of the plurality of 2-way dividers.

17. A system as recited in claim 16, wherein any of the M output ports and N input ports can be connected to any combinations of: antenna, a CPL antenna, RF receive port, transmit port, amplifier, RF switch, low noise amplifier (LNA), oscillator, tuning circuit, matching circuit, lumped element circuit, active circuit, diode, adjustable inductive circuit, and adjustable capacitive circuit.

18. The system of claim 16, wherein each of the M output ports of the N-way RF divider are coupled to a CPL antenna.

19. The system of claim 18, wherein at least one of the CPL antennas is configured to have adjustable properties, and to be a passive antenna, a passive and adjustable antenna, or an active antenna.

20. The system of claim 16, further comprising an RF switch connected between a first output port of the N-way RF divider and an antenna coupled to said first output port.

21. The system of claim 20, wherein an RF switch is connected between each output port and the corresponding antenna connected to the output port, wherein the system is configured to selectively shape the overall radiating pattern of the combination of RF antennas.

* * * * *